US006449308B1

(12) United States Patent
Knight, Jr. et al.

(10) Patent No.: US 6,449,308 B1
(45) Date of Patent: Sep. 10, 2002

(54) HIGH-SPEED DIGITAL DISTRIBUTION SYSTEM

(75) Inventors: Thomas F. Knight, Jr., Belmont; Nandu J. Marketkar, Boylston, both of MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/318,287

(22) Filed: May 25, 1999

(51) Int. Cl.[7] ............................................... H04L 25/20
(52) U.S. Cl. ...................... 375/212; 375/220; 375/257; 370/438; 71/110; 71/129; 71/131
(58) Field of Search ................................. 375/212, 220, 375/221, 257, 258; 370/437, 438; 710/110, 119, 124, 129, 131

(56) References Cited

U.S. PATENT DOCUMENTS

| | | | | |
|---|---|---|---|---|
| 3,619,504 A | * | 11/1971 | De Veer et al. ............... | 178/68 |
| 5,301,208 A | * | 4/1994 | Rhodes ......................... | 375/36 |
| 5,365,205 A | * | 11/1994 | Wong ........................... | 333/109 |
| 5,629,838 A | | 5/1997 | Knight et al. ................ | 361/782 |
| 5,638,402 A | * | 6/1997 | Osaka et al. ................. | 375/257 |
| 5,946,198 A | * | 8/1999 | Hoppe et al. ................ | 361/813 |
| 6,091,739 A | * | 7/2000 | Simonovich et al. ........ | 370/458 |

OTHER PUBLICATIONS

David B. Salzman, Ph.D. and Thomas F. Knight, Jr., Ph.D., "Capacitively Coupled Multichip Modules," MCM '94 Proceedings, pp. 487–494.
Thomas F. Knight, Jr., Ph.D. and David B. Salzman, Ph.D., "Manufacturability of Capacitively Coupled Multichip Modules," ECTC Conference, May 1994, pp. 605–608.

Thomas F. Knight, Jr., "Technologies for Low Latency Interconnection Switches," ACM Symposium on Parallel Algorithms and Architectures, Jun. 1989, pp. 351–358.
Richard Crisp, "Direct Rambus Technology: The New Main Memory Standard," Nov./Dec. 1997 issue of IEEE Micro., pp. 18–28.
Steve Kaufer, "Controlling crosstalk in high–speed digital systems," *Electronic Systems*, May 1999, pp. 31–35.

* cited by examiner

*Primary Examiner*—Stephen Chin
*Assistant Examiner*—Dac V. Ha
(74) *Attorney, Agent, or Firm*—Blakely, Sokoloff, Taylor & Zafman LLP

(57) ABSTRACT

A high-speed digital distribution system is presented that includes a transmission line bus that carries modulated digital signals and reference signals. The transmission line bus has a first end electrically connected to a bus interface that modulates digital data onto said transmission line bus and demodulates modulated digital data signals that it receives from the transmission line bus. The bus interface can transmit and receive a reference signal. At least one digital component interface is in electromagnetic communication with the transmission line bus, and each digital component interface can also modulate digital data onto the transmission line bus and can demodulate modulated digital data signals received from the transmission line bus, and can transmit and receive a reference signal. The transmission line bus communicates modulated digital data in association with the reference signal between and among an external device connected to the bus interface and the at least one digital component interface. In one embodiment, the digital data is quadrature amplitude modulated with an encoding that uses one to five bits for the phase component and zero to three bits for the amplitude component. In another embodiment the transmission line bus has characteristic impedance and has matched terminations at its first and second ends.

48 Claims, 21 Drawing Sheets

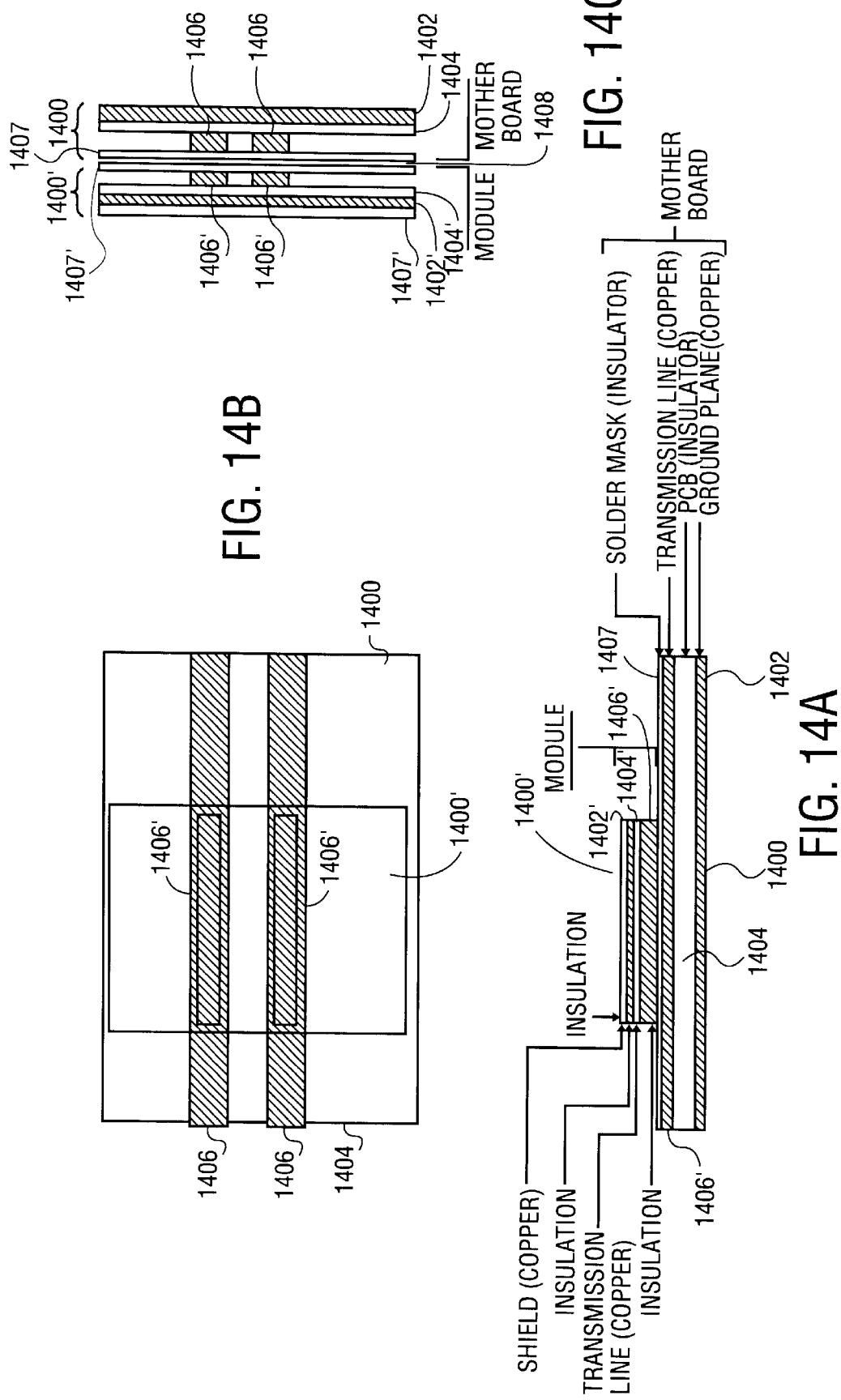

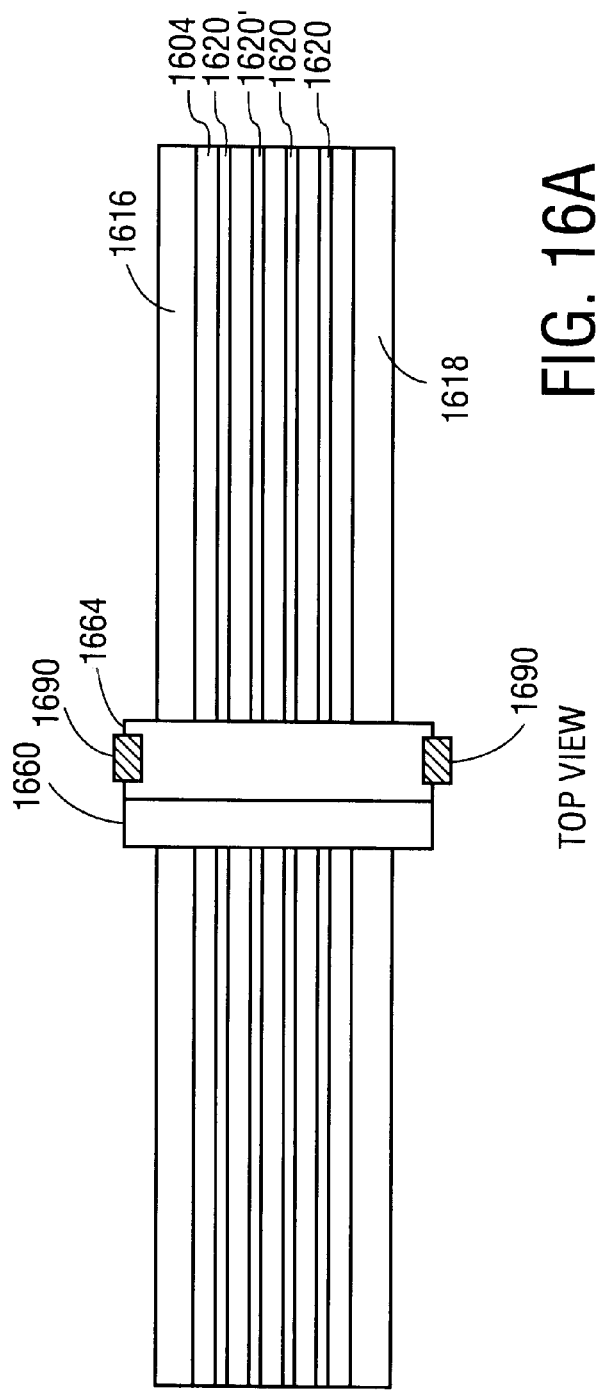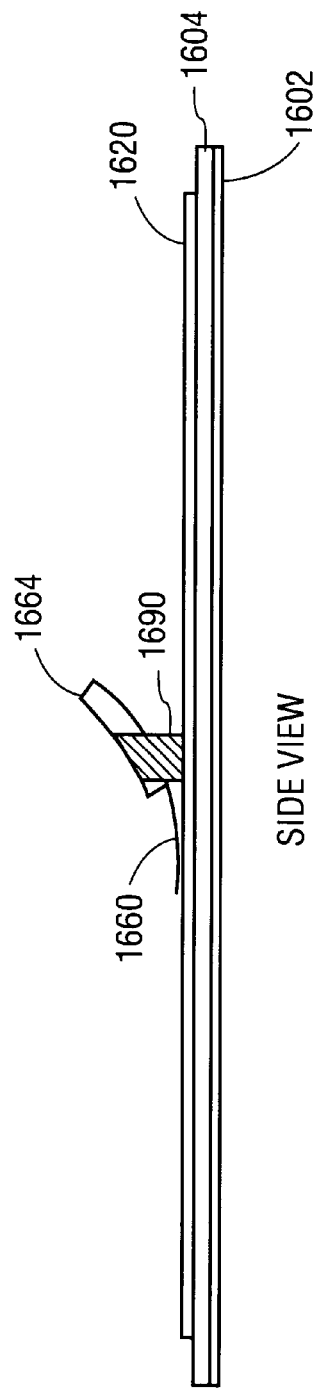
FIG. 16A
FIG. 16B

HIGH-SPEED DIGITAL DISTRIBUTION SYSTEM

FIELD OF THE INVENTION

The present invention relates to an apparatus and method for the communication of digital signals at high speed, and more particularly the communication of modulated digital signals.

BACKGROUND

The communication of digital information within a computer system can represent one of the bottlenecks in achieving high rates of computation. It is becoming apparent to many that conventional technologies for moving data between semiconductor memory and a Central Processor Unit (CPU), while much faster than moving data between other types of storage devices, such as CD-ROMs or magnetic disks, and the CPU, are approaching a practical upper limit. One solution that has been applied to try to solve this problem of communication speed is to increase the system clock rate. However, given the pinout geometries of conventional memory systems, it is difficult to operate such systems at speeds above about 100 MHz. Another approach that could be taken is to attempt to clock data at both the rising edge and the falling edge of clock signals. This approach places severe constraints on clock access times, requiring at least a factor of two improvement in output delay of the memory chip. Another approach involves the use of a wider bus, employing 128 bits rather than 64 bits of width. Such an approach involves many changes in computer system design, including a major redesign of PCB board layouts, changes in pinouts and significant increases of pin counts for packages, and changes in the length of words in software design, for example.

Yet another approach is the Direct Rambus DRAM technology. In this approach, a wide internal bus is connected via a high-speed interface to a narrow external bus. The internal bus 144/128-bit data path operates at 16 bytes every 10 ns internally, which is transformed into an external 2-byte wide 1.25 ns bus. The system uses a bus clock at 400 MHz. Because data transfers are synchronized to both clock edges, the rate is effectively raised to 800 MHz. This system is stated to yield a 1,600 Mbyte/s bandwidth. One significant electrical difference from conventional systems is that memory modules are connected such that any data signal must sequentially traverse all the memory modules present, rather than reaching a particular module without passing all of the others.

Conventional processor to memory interconnection buses drive a set of memory components, typically SIMMs or DIMMs, with a motherboard signal trace which runs between SIMM connectors (FIG. 1). Typically, this line is driven with a series resistance, and treated as a single lumped capacitive load. Signals are driven with a single polarity, rail to rail, as baseband digital signals.

The impedance of such a bus wire is very low, because of the periodic capacitive stubs added by the connector and SIMM traces and components. An initially unloaded 100 ohm impedance line, constructed as a stripline on commercial FR-4 material having K=4, has a capacitance per unit length of 0.67 pF/cm. When loaded with a relatively modest 20 pF load each 2 cm, the effective capacitance per unit length rises to 10.67 pF/cm, resulting in an impedance of about 25 ohms, and a reduction in the speed of propagation from half the speed of light (c/2) to approximately one-eighth the speed of light (c/8). This dramatic speed and impedance reduction makes it impractical, from a noise and power standpoint, to correctly terminate the bus with a parallel termination. Series terminations cannot be used for high quality signals because of the signal stairstep behavior at intermediate positions in a multidrop environment.

Moreover, the equivalent electrical line length of the 2 cm connector spacing rises to 16 cm, with approximately 500 ps of delay. This delay is significant compared to the risetime of a typical digital signal. The delay encourages stub reflections in a correctly terminated environment. Most such buses are driven with a series resistance to intentionally slow the incident edges, resulting in poor bandwidth, and sloppy signaling.

Conventional high-speed digital systems suffer from a variety of problems. An article entitled "Controlling crosstalk in high-speed digital systems," which appeared in the May 1999 issue of Electronic Systems at page 31, makes reference to crosstalk in the following terms. "The advent of higher switching speeds in modern digital systems has introduced a host of difficult-to-solve problems: signal reflections, delay-time degradation, crosstalk, and electromagnetic-compatibility failures. At driver-IC switching times of 4 to 5 ns or less, PCB traces begin to exhibit their circuit characteristics. Unfortunately, these parameters are generally unwelcome and must be carefully designed around. Of all high-speed effects, crosstalk is perhaps the least understood and the hardest to predict. Yet, it can be controlled and even eliminated."

SUMMARY OF THE INVENTION

It is therefore a principal object of this invention to provide a high-speed digital distribution system that includes a transmission line bus that carries modulated digital signals and reference signals. It is another principal object for such a high speed digital distribution system to modulate digital data using quadrature amplitude modulation. It is another principal object for such a high speed digital distribution system to include a bus interface that is electrically connected to the bus and one or more digital component interfaces that are electromagnetically connected to the bus. It is another principal object for such a high speed digital distribution system to include one or more digital component interfaces that can be connected to or disconnected from the bus while the system is in operation.

A high-speed digital distribution system is presented which relates to a transmission line bus that carries modulated digital signals and reference signals. The transmission line bus has a first end electrically connected to a bus interface. The bus interface modulates digital data onto said transmission line bus and demodulates modulated digital data signals that it receives from the transmission line bus. The bus interface can transmit and receive a reference signal. At least one digital component interface is in electromagnetic communication with the transmission line bus. The digital component interface can also modulate digital data onto the transmission line bus and can demodulate modulated digital data signals received from the transmission line bus, and can transmit and receive a reference signal. The transmission line bus communicates modulated digital data in association with the reference signal between and among an external device connected to the bus interface and the at least one digital component interface. In another embodiment, the system includes a reference source which can provide a reference signal to at least one of the bus interface and the at least one digital component interface. In yet another embodiment, the system includes a digital component that is electrically interfaced with the at least one digital component interface, and that transmits and receives the digital data and the address signal. In still another embodiment, the digital data is quadrature amplitude modulated with the reference signal. In a further embodiment, the digital data is quadrature amplitude modulated with an encoding that uses one to five bits for the phase component and zero to three bits for the amplitude component. In yet a further embodiment the transmission line bus has characteristic impedance and has matched terminations at its first and second ends. In another embodiment, the reference signal and the modulated data signal can be multiplexed onto the same conductor of the transmission line bus. In another embodiment, the digital component interface includes a transmission line that can couple electromagnetic radiation to and from the transmission line bus. In another embodiment, the digital component interface includes a directional coupler that can communicate with the transmission line bus by coupling electromagnetic radiation to and from the transmission line bus. In another embodiment, the digital component interface is removably attached to the system. In yet another embodiment, the digital component interface can be attached to or removed from the system while the system is in operation. In still another embodiment, the digital component interface includes an electrical connection to a power supply.

The present invention further relates to an apparatus for distributing digital signals, which includes a transmission line bus having a first end. A first interface is electrically connected to the transmission line bus, and a second interface is electromagnetically coupled to the transmission line bus. A reference signal source that provides a reference signal including a phase component and an amplitude component is provided. A first digital device is electrically connected to the first interface and a second digital device is electrically connected to the second interface. One of the first interface and the second interface modulates digital data provided by the digital data device connected thereto with the reference signal to encode the digital data in a quadrature amplitude modulated signal and transmits the modulated data onto the transmission line bus, and another of the first interface and the second interface receives and demodulates the modulated digital data and provides demodulated data to the digital device connected thereto.

The present invention also relates to a method of distributing digital signals, which includes the steps of providing a reference signal, providing a transmission line bus, and providing a first interface and a second interface, at least one interface being electrically connected to the transmission line bus, and at least one interface being electromagnetically coupled to the transmission line bus, both interfaces adapted to receive and to transmit the reference signal. The method further includes the steps of providing digital data to the first interface, causing the first interface to modulate the digital data in conjunction with the reference signal and to impress the modulated data onto the transmission line bus in conjunction with the reference signal, and causing the second interface to receive and demodulate the modulated digital data in conjunction with the reference signal. In another embodiment, the method includes the step of causing the first interface to quadrature amplitude modulate the digital data with the reference signal and to impress the modulated data onto the transmission line bus in conjunction with the reference signal. In yet another embodiment, the method includes the step of causing the first interface to quadrature amplitude modulate the digital data with the reference signal in which the encoding uses from one to five bits for a phase component and from zero to three bits for and amplitude component. In still another embodiment, the data is frequency modulated. In a further embodiment, the data is spread spectrum modulated. In still a further embodiment, the data is amplitude modulated. In still a further embodiment, the data is single sideband modulated.

The present invention further relates to a high-speed digital distribution system which includes a transmission line bus which has a first end that carries modulated digital signals and reference signals, a bus interface electrically connected to the first end of the transmission line bus so that the bus interface can modulate digital data onto the transmission line bus and can demodulate modulated digital data signals received from the transmission line bus. The bus interface can transmit and receive a reference signal. The system also includes at least one digital component in electromagnetic communication with the transmission line bus so that the digital component can modulate digital data onto the transmission line bus and can demodulate modulated digital data signals received from the transmission line bus. The digital component can transmit and can receive a reference signal. The transmission line bus communicates modulated digital data in association with a reference signal between and among an external device connected to the bus interface and the at least one digital component. In another embodiment, the system includes a reference source which can provide a reference signal to at least one of the bus interface and the at least one digital component. In still another embodiment, a reference signal includes a phase component and an amplitude component. In still a further embodiment, a reference signal is quadrature amplitude modulated. In yet a further embodiment, the digital data is encoded using from one to five bits for the phase component and from zero to three bits for the amplitude component. In other embodiments, the digital data may be modulated using frequency modulation, spread spectrum modulation, amplitude modulation, or single sideband encoding. In a further embodiment, the system may include a characteristic impedance and may be terminated with matched terminations at its first end and at a second end. In a still further embodiment, the system includes a series impedance substantially equal to the characteristic impedance and connected between the bus interface, that represents a voltage source, and the first end of the bus, and a parallel impedance substantially equal to the characteristic impedance and connected between the second end of the bus and ground. In yet a further embodiment, the system includes a bus interface that represents a current source, a parallel impedance substantially equal to the characteristic impedance that is connected between the first end of the bus and ground, and a parallel impedance substantially equal to the characteristic impedance and connected between the second end of the bus and ground. In another embodiment, the digital component includes a directional coupler in electromagnetic communication with the transmission line bus. In still another embodiment, the digital component is removably attached to the system. In yet another embodiment, the digital component can be attached to or detached from the system while the system is in operation. In still a further embodiment, the digital component includes a connection to a power supply. In a still further embodiment, one interface that is electromagnetically coupled to the transmission line bus can modulate data in conjunction with a reference signal and impress the modulated data on the transmission line bus in conjunction with the reference signal, and a second interface that is electromagnetically coupled to the transmission line bus can receive modulated data in conjunction with a reference signal from the transmission line bus and can demodulate the modulated data in conjunction with the reference signal.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

FIGS. 16A and 16B depict an alternative embodiment of a digital device interface of the present invention showing connections for the provision of DC power and ground signals.

DETAILED DESCRIPTION OF THE INVENTION

Many of the difficulties in digital signaling arise from a poor match between the channel characteristics and the signaling technique. As the speed of signaling rises, and the electrical behavior of on chip and on board wiring channels remains the same, or deteriorates, there is a growing mismatch between the traditional approaches of baseband signaling and the channel characteristics. Typical modern wiring layers are thinner, closer, and more resistive than older wiring. This, together with dielectric insulator losses, leads to highly dispersive behavior at gigabit signaling rates.

One can express bandwidth in both absolute measure and relative measure. An absolute measure may be expressed as N megahertz or gigahertz, where N is a number. A relative measure of bandwidth may be expressed in units such as octaves, an octave representing a range in frequency space that covers a change in frequency by a factor of 2. It is far easier to maintain a gigahertz wide channel between two and three gigahertz, than between zero and one gigahertz. In the first case, we have a half-octave wide channel; in the second, an infinite number of octaves. In the first case, the channel dispersion is negligible; in the second, dominant.

One can make use of this behavior by using modulation techniques for transmitting signals over modem wiring channels. For example, modems are used in sending modulated digital data over telephone lines at far lower rates than is contemplated here, by modulating the data and transmitting the information in the form of tones in a series of frequencies. These signals can be received, demodulated, and reconverted to digital information. The present invention contemplates performing similar transformations on digital data, and transmitting such modulated data at rates unheard of in current modem technology. In particular, the present invention contemplates the use of Quadrature Amplitude Modulation (QAM) techniques for such signaling, although similar spectrum engineering advantages accrue to the use of other modulation techniques, including such methods as phase, frequency, amplitude, single sideband, wavelet, or spread spectrum modulation.

Figure 1:
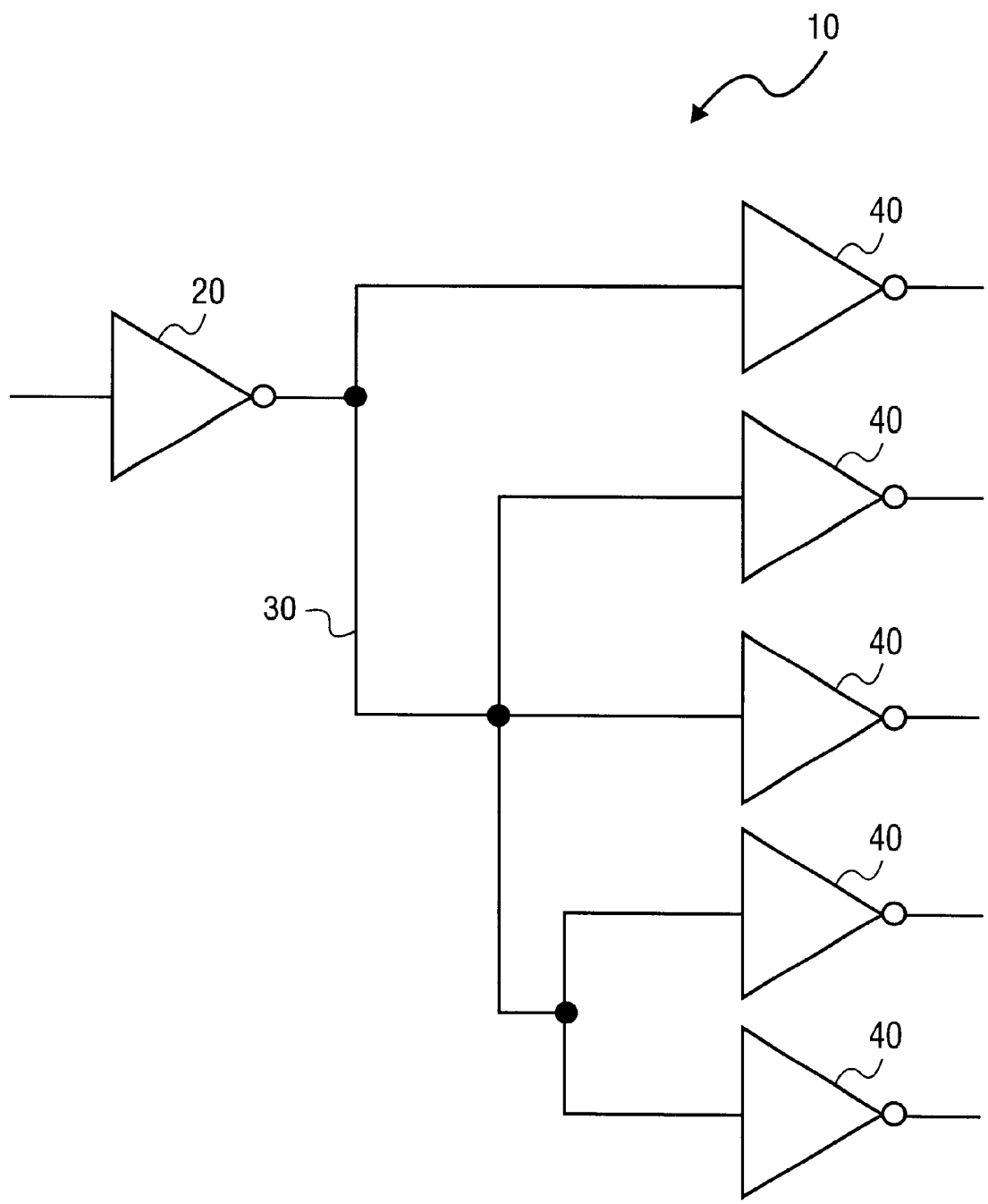
FIG. 1 depicts a conventional prior art memory interconnection bus with lumped capacitive interconnections.

Referring now to FIG. 1, which depicts a conventional prior art memory interconnection bus 10 with lumped capacitive interconnections, there is a driver 20, which can be for example a computer Central Processing Unit (CPU). The driver 20 is electrically connected to a bus 30. Bus 30 is depicted as having a plurality of memory devices 40 connected to it at a number of locations. For TTL technology, this type of connection, where one driver 10 communicates with a plurality of devices 40 connected in parallel, is referred to as having a "fan-out" of X- to 1, where X is the number of devices 40 being driven by the one driver 10. Fan-out is typically measured in terms of current required to operate a device as a load. In a circuit having X parallel legs, the voltage across each of the legs is the same, and the total current is the sum of the currents drawn by each of the legs. For CMOS technology, a measure of fanout is the total input capacitance that is present with respect to the loads.

However, if X devices are connected in series, the current through each device is common to all, while the voltage drop across each device can in principle be different for each device. The Rambus technology attempts to make use of the possibility of serial connection of memory devices. However, a cost must be incurred to operate memory devices in a serial fashion. The signals which are intended for a specific device pass through every device, so there must be a method by which the signal is encoded to communicate which device is the intended recipient of the signal. This requires the use of additional bits which must be transmitted with the data, and which must be encoded and decoded.

Another limitation in the design of conventional multidrop signal distribution schemes is that the wire carrying the signal must make electrical contact with each of the data recipients. Thus in the lumped capacitive distribution model, the signal bus connects to each destination in an arbitrary way, as depicted in FIG. 1. No deliberate attempt is made to control the impedance, the length, or other important properties of the wiring. This wiring strategy is suitable only for wires which are short compared to the wavelength of significant frequency signal components, and thus can only be used in relatively low frequency (and long wavelength) systems.

Figure 2:
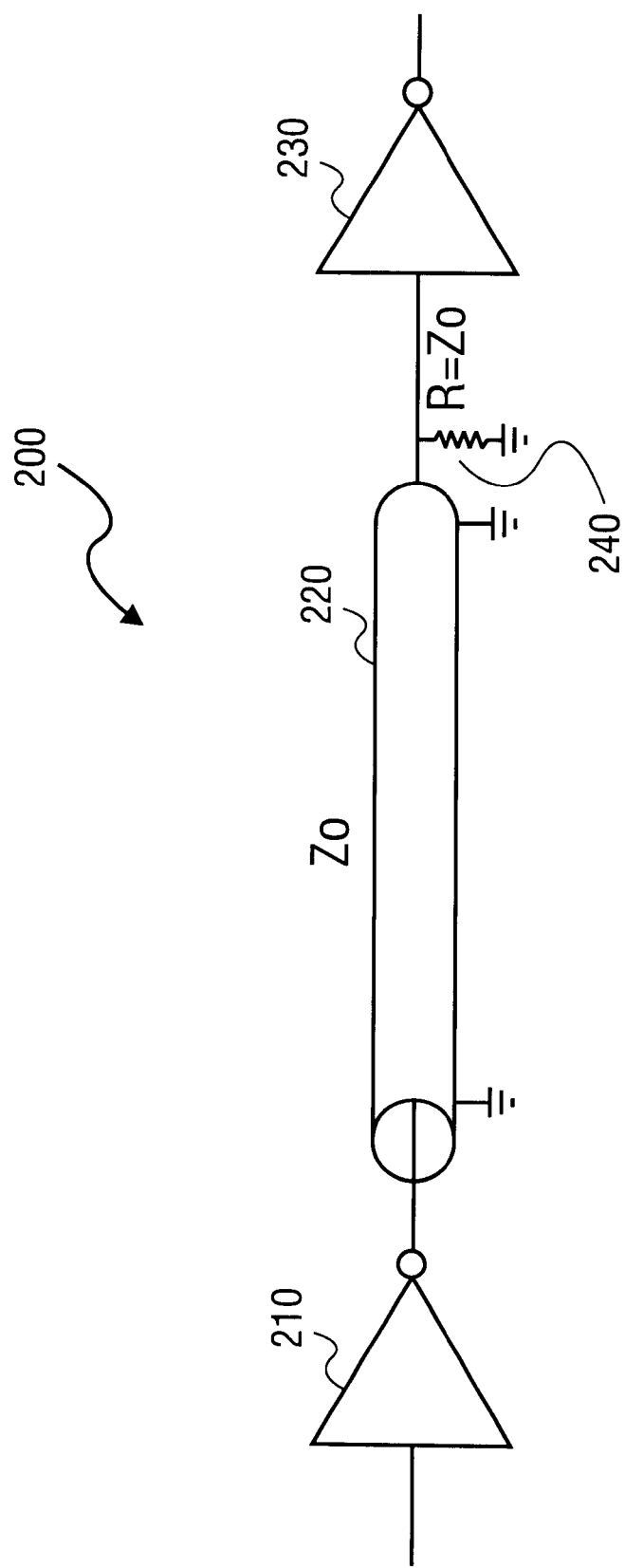
FIG. 2 depicts an embodiment of a point-to-point signal carrying transmission line, terminated with a parallel resistance at the end remote from the driver, equal in value to the characteristic impedance of the transmission line.

FIG. 2 depicts an embodiment of a point-to-point signal carrying transmission line, generally 200, terminated with a parallel resistance 240 at the end remote from the driver 210, and equal in value to the characteristic impedance of the transmission line 220. A digital device 230 is also depicted as being attached to the transmission line 220 at the end remote from the driver 210. Wiring of this kind exhibits delay, but otherwise the signal propagates without distortion. This strategy is suitable for high speed point-to-point communications between components.

Figure 3:
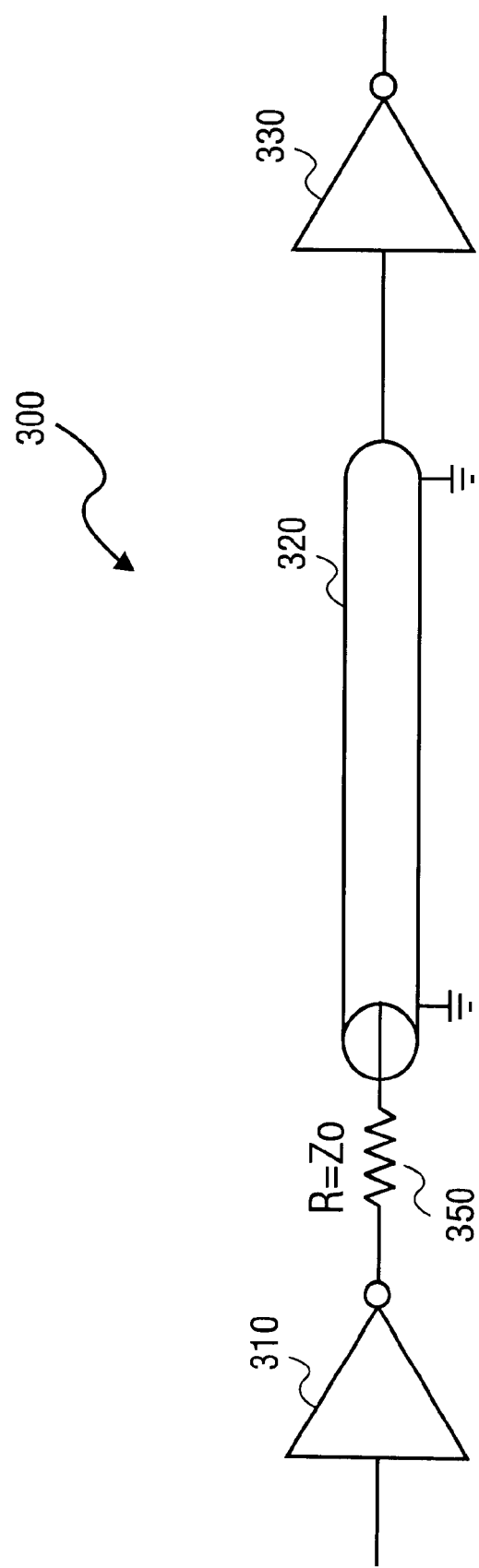
FIG. 3 depicts an embodiment of a point-to-point signal carrying transmission line, terminated with a series resistance at the driver, equal in value to the characteristic impedance of the transmission line.

FIG. 3 depicts an embodiment of a point-to-point signal carrying transmission line, generally 300, terminated with a series resistance 350 at the driver 310, and equal in value to the characteristic impedance of the transmission line 320. A digital device 330 is also depicted as being attached to the transmission line 320 at the end remote from the driver 310. In this scheme, the signal propagating along the transmission line 320 is of half the amplitude of the logic signal swing, due to the series resistance 350. The high impedance at the end of the transmission line 320 induces a full amplitude reflection, which, when superposed with the incoming signal results in a full amplitude signal at the receiver 330, undistorted except for delay. Note, however, that signals at other locations along the transmission line 320 will consist of a superposition of the forward and backward propagating signals, and will, in general, be useless for driving digital signals. Thus this approach is suitable only for point-to-point signals.

Figure 4:
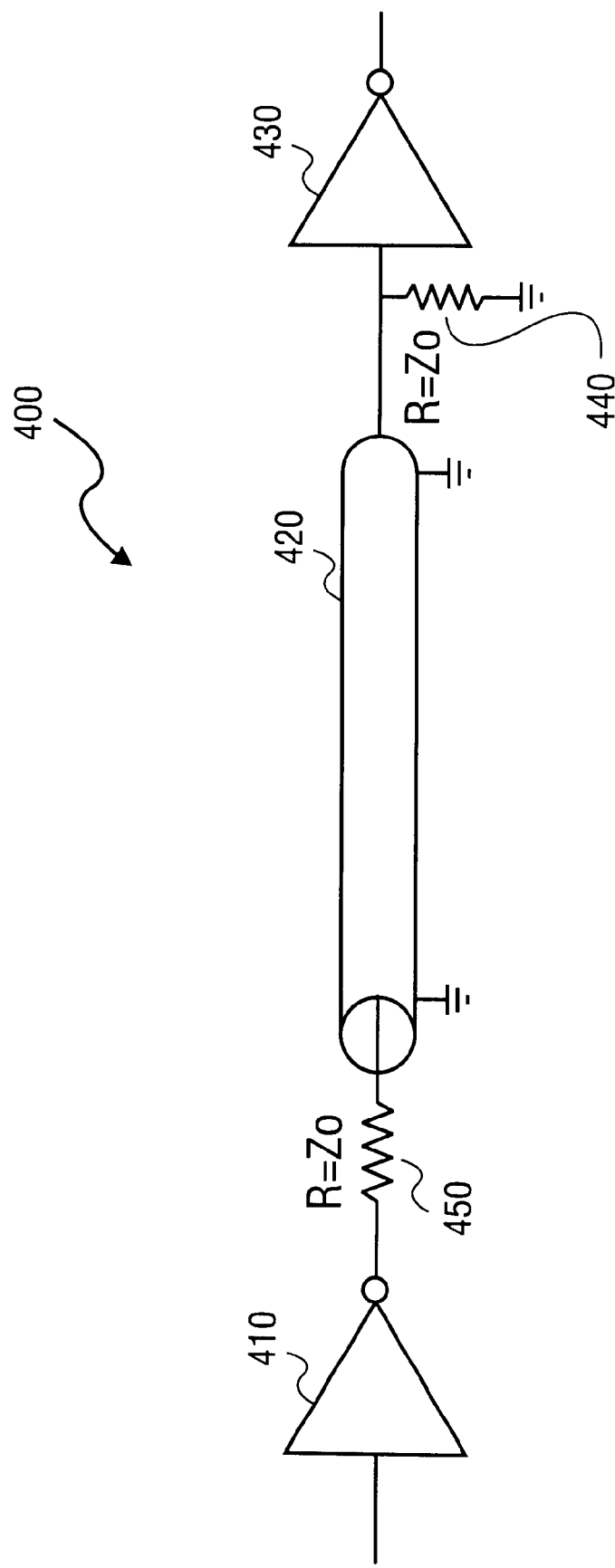
FIG. 4 depicts an embodiment of a point-to-point signal carrying transmission line, terminated with a series resistance at the driver and terminated with a parallel resistance at the end remote from the driver, both equal in value to the characteristic impedance of the transmission line.

FIG. 4 depicts an embodiment of a point-to-point signal carrying transmission line, generally 400, terminated with a series resistance 450 at the driver 410 and terminated with a parallel resistance 440 at the end remote from the driver, both equal in value to the characteristic impedance of the transmission line 420. A digital device 430 is also depicted as being attached to the transmission line 420 at the end remote from the driver 410. By terminating with both series resistance 450 and parallel resistance 440 terminations, the forward signal is terminated at the receiver 430, and no signal doubling results. There should ideally be no backward propagating signal. However, the series driver resistance 450 terminates any backward propagating signal which might result from a mismatch. This scheme is much more robust against transmission line 420 imperfections and crosstalk than either the purely parallel scheme of FIG. 2 or the purely series scheme of FIG. 3. One difficulty of this scheme is a reduction of signal amplitude at the receiver 430 by a factor of two, since there is no the reflection at the receiver 430 as in FIG. 3. A benefit that results from this dual termination configuration is that the signal will be undistorted at all positions along the transmission line 420.

Figure 5:
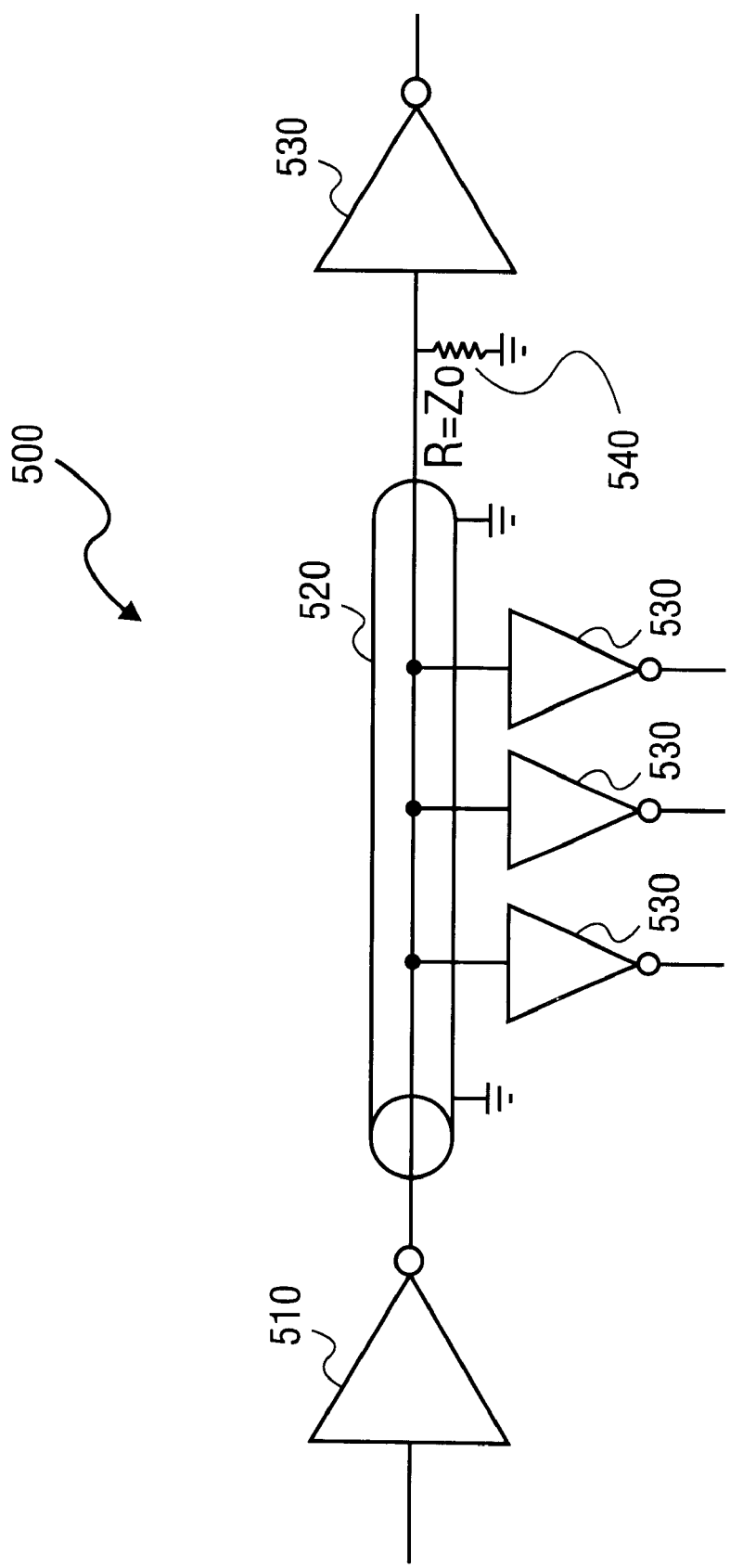
FIG. 5 depicts an embodiment of a parallel terminated multidrop transmission line.

FIG. 5 depicts an embodiment of a parallel terminated multidrop transmission line, generally 500. Driver 510 applies a driver signal to the transmission line bus 520 that is parallel terminated by a characteristic impedance 540. There are a plurality of receivers 530 in electrical communication with bus 520. Each receiver 530 will see a (differently) delayed version of the driver signal in undistorted form. This is the traditional approach for constructing multidrop high speed signal distribution systems. As has been described above in connection with FIG. 2, undistorted copies of the signal are present at all positions along the transmission line bus 520, the copies can be used to drive receivers 530 as shown.

Figure 6:
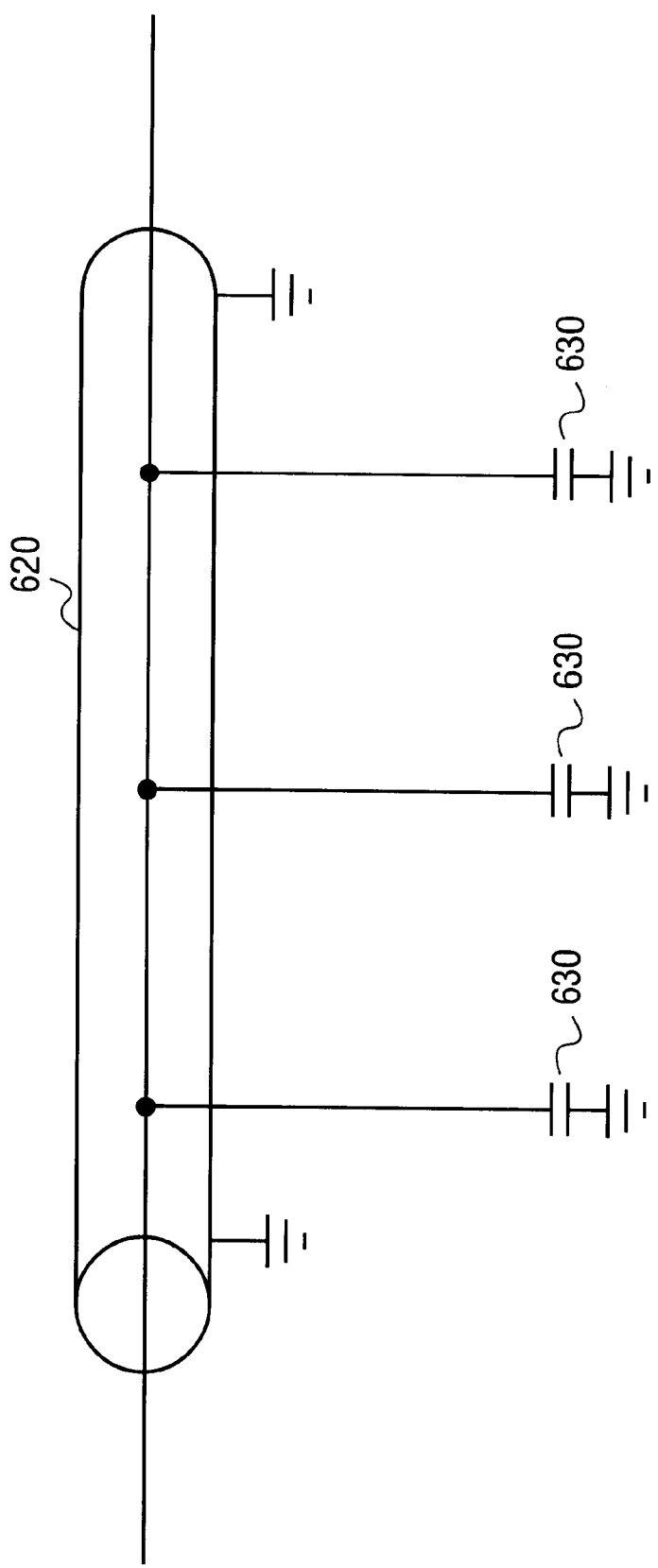
FIG. 6 depicts an electrical model of the multidrop transmission line of FIG. 5.

FIG. 6 depicts an electrical model of the multidrop transmission line of FIG. 5. Each receiver 530 of FIG. 5, and the wire stub for that receiver, acts electrically as a lumped capacitive load 630 on the transmission line bus 620. A lumped capacitive load 630 causes impedance discontinuities and reflections at high frequencies and a lowering of both the line impedance and the signal propagation speed on the transmission line bus 620. This results in significant increases in power dissipation, in increased power required to drive the transmission line bus 630, and in increased delays in the arrival of the signal at distant points along the line.

Figure 7A:
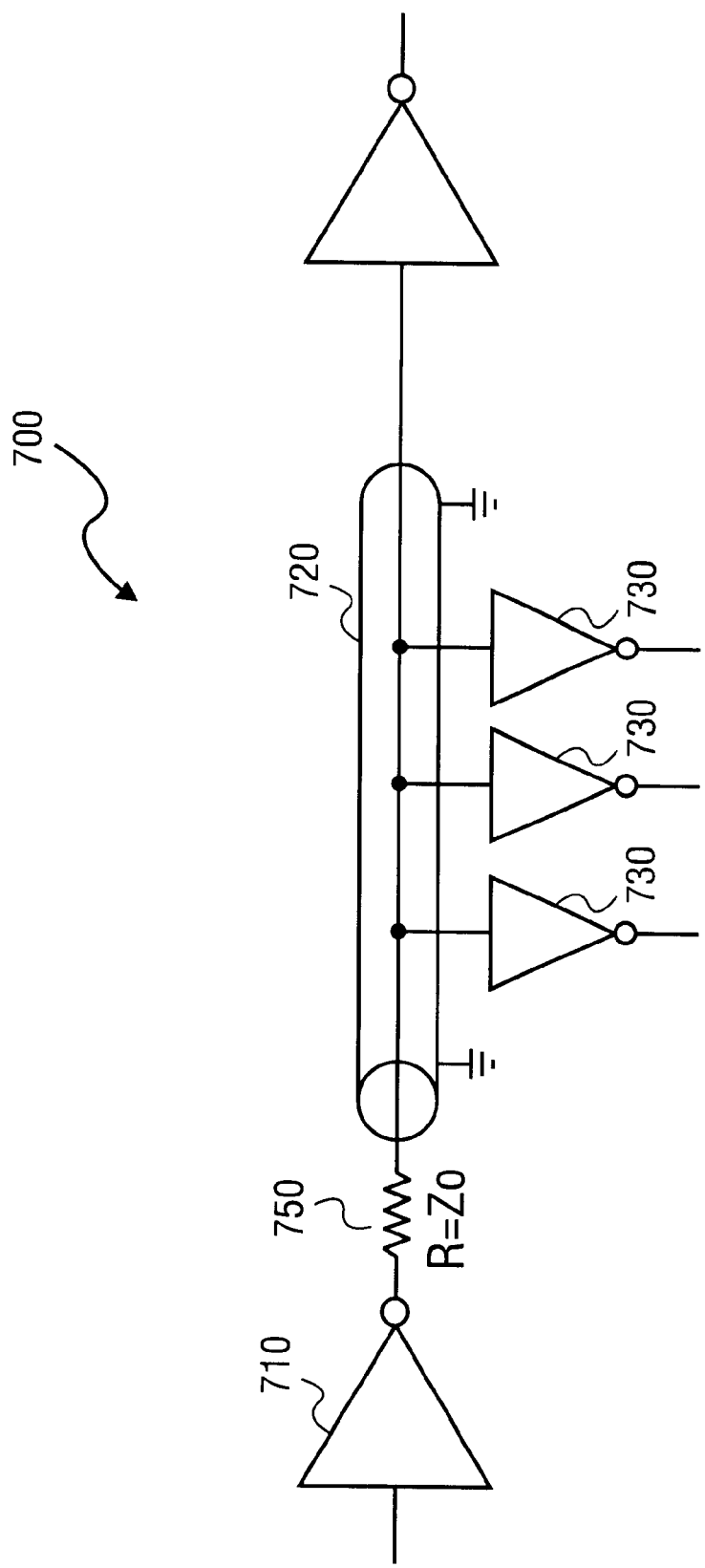
FIG. 7A depicts an embodiment of a multidrop transmission line having a series termination at one end.

FIG. 7A depicts an attempted implementation of a multidrop transmission line, generally 700, using series termination 750 approaches. Here, the distortion of the signal caused by the superposition of the forward and backward waves, as described by FIG. 3, makes this scheme unworkable.

Figure 7B:
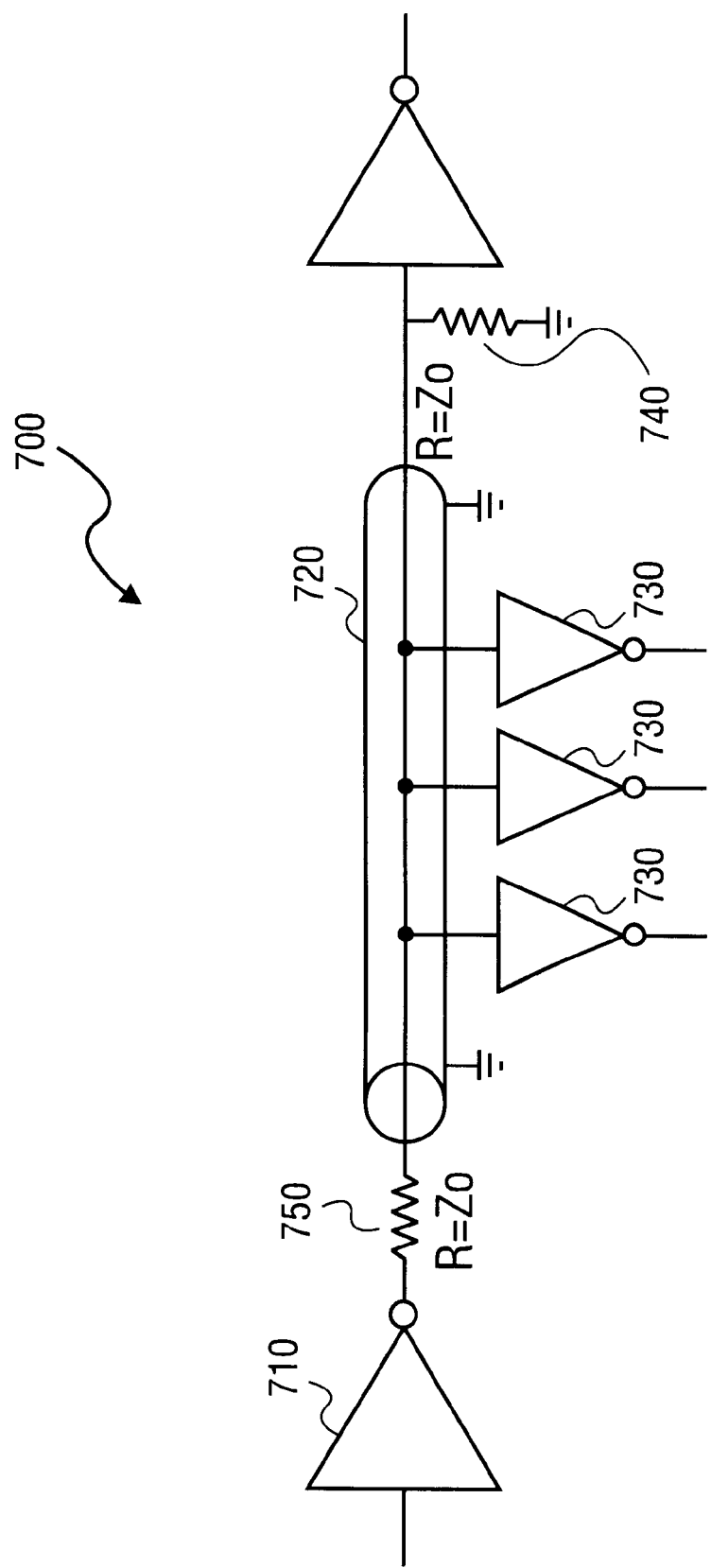
FIG. 7B depicts an embodiment of a multidrop transmission line having terminations at both ends.

FIG. 7B depicts an embodiment of a multidrop transmission line, generally 700, having terminations at both ends. Addition of a parallel termination 740 at the end of the transmission line eliminates the reflected backward wave but the signal amplitude is reduced by a factor of two, resulting in improper data being received by receivers 730.

Figure 8:
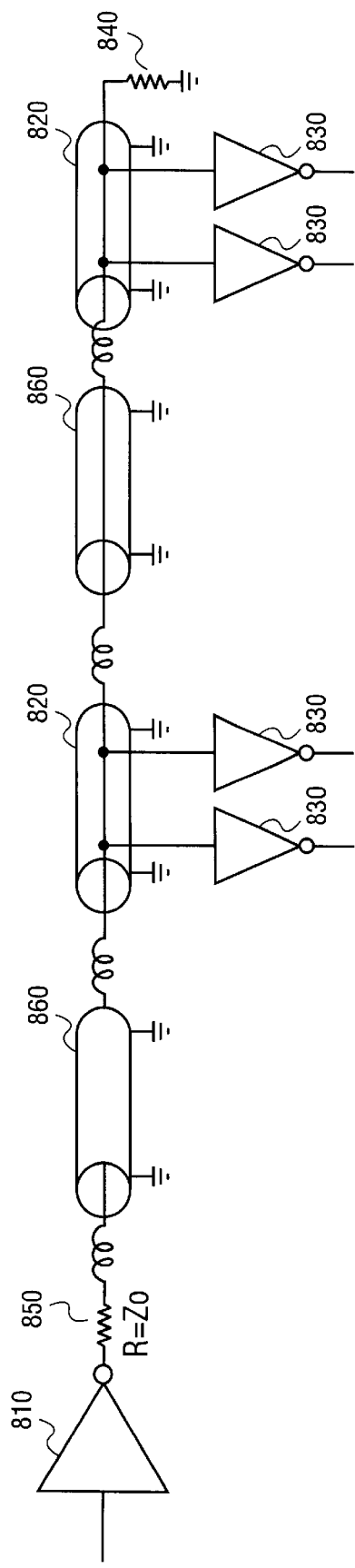
FIG. 8 depicts an embodiment of a multidrop transmission line with multiple connectors attached at different locations.

FIG. 8 depicts an embodiment of a multidrop transmission line bus, generally 800, with multiple connectors attached at different locations. The transmission line bus 820 can be terminated at both ends with the characteristic impedance 840, 850. In general, such a transmission line bus 820 can be constructed using different PC board materials. Different sections of the transmission line bus 820 will therefore have different characteristic impedances, due to manufacturing variations. Electrical connectors 860 that have significant series inductance at the relevant signal frequency connect the transmission line bus 820 sections to one another. The capacitive loads are not evenly distributed along the line, resulting in further changes in the effective impedance of transmission line bus 820 that will be seen at driver 810.

Figure 9:
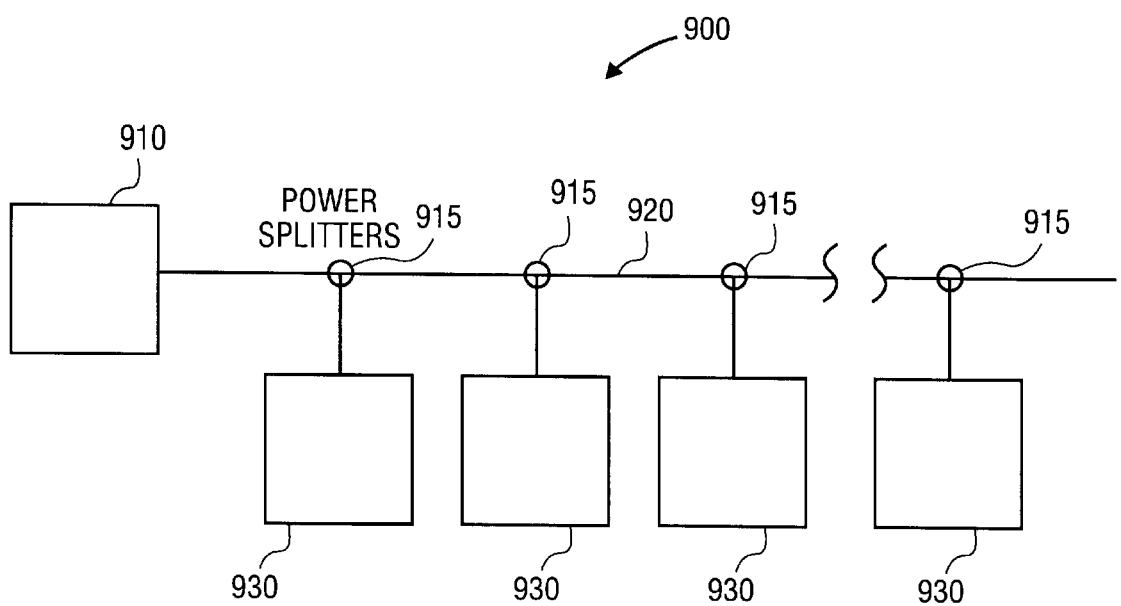
FIG. 9 depicts an embodiment of a prior art traditional bus with power splitters.

FIG. 9 depicts an embodiment of a prior art traditional bus, generally 900, with driver 910 and power splitters 915. In this alternative arrangement, the loads on the transmission line 920 are isolated from the line and from one another by use of power splitters 915. The key insight is that one need not deliver all the signal power to each load pin. Instead one splits the power, delivering only a fraction of the destination power to each load 930. Each load 930 can then terminate the received power, and, at the cost of reduced signal amplitude, a multidrop transmission line can be constructed with nearly ideal electrical performance. The power splitters 915 used in this structure are chosen to typically couple only a small portion of the power transferred along the main transmission line 920 into each load 930. In addition, data may be transmitted backward through the power splitters 915, leading to an attenuated signal at the input.

Figure 10:
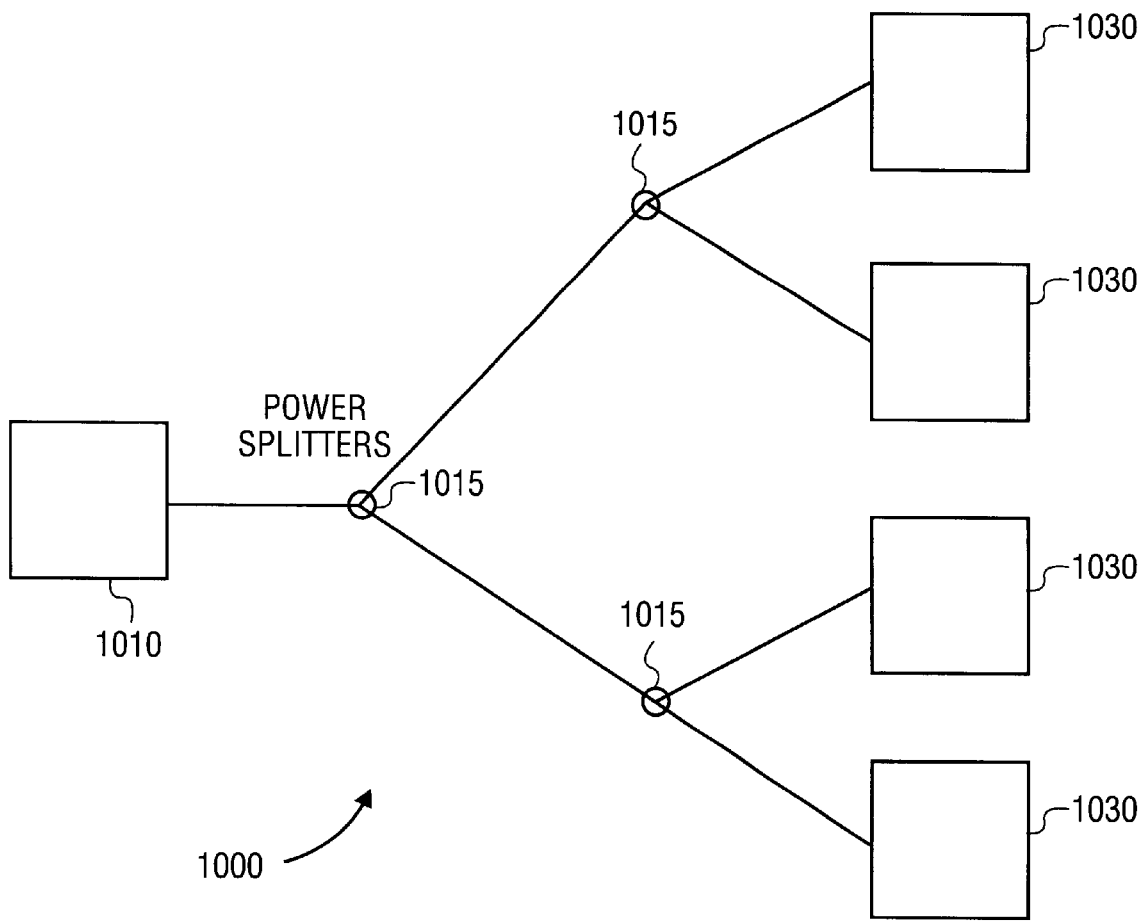
FIG. 10 depicts an embodiment of a prior art traditional network with power splitters.

FIG. 10 depicts an alternative embodiment of a prior art traditional network, generally 1000, with driver 1010 and power splitters 1015. Here, the loads 1030 are arranged in a tree. Power splitters 1015 are located at each intersection of branches. The power splitters 1015 in this structure are typically chosen to divide the power roughly equally between each branch of the structure. In addition, data may be transmitted backward through the power splitters 1015, leading to an attenuated signal at the input. Several alternatives are possible in constructing power splitters.

Figure 11:
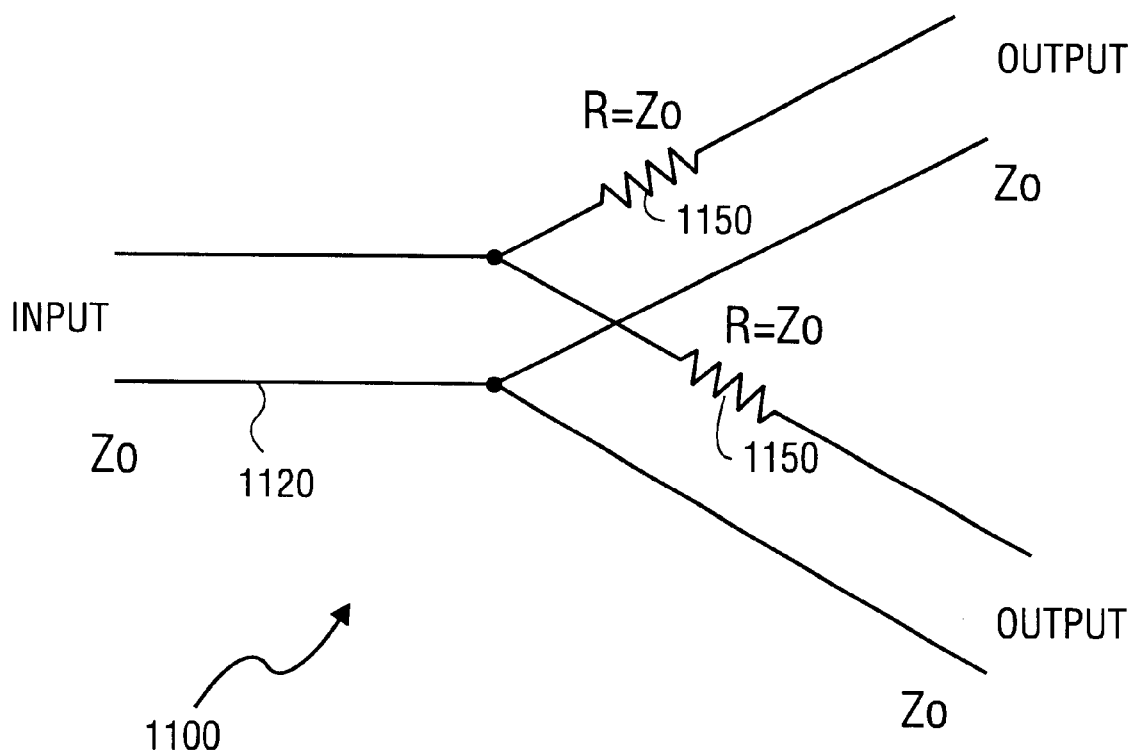
FIG. 11 depicts a prior art power splitter design using series terminations consisting of resistors having the characteristic impedance value of the transmission line.

FIG. 11 depicts a prior art power splitter design, generally 1100, using series terminations consisting of resistors 1150, 1150' having the characteristic impedance value of the transmission line 1120. The correct choice of the resistance values results in impedance matching of the line to all of the loads.

Figure 12:
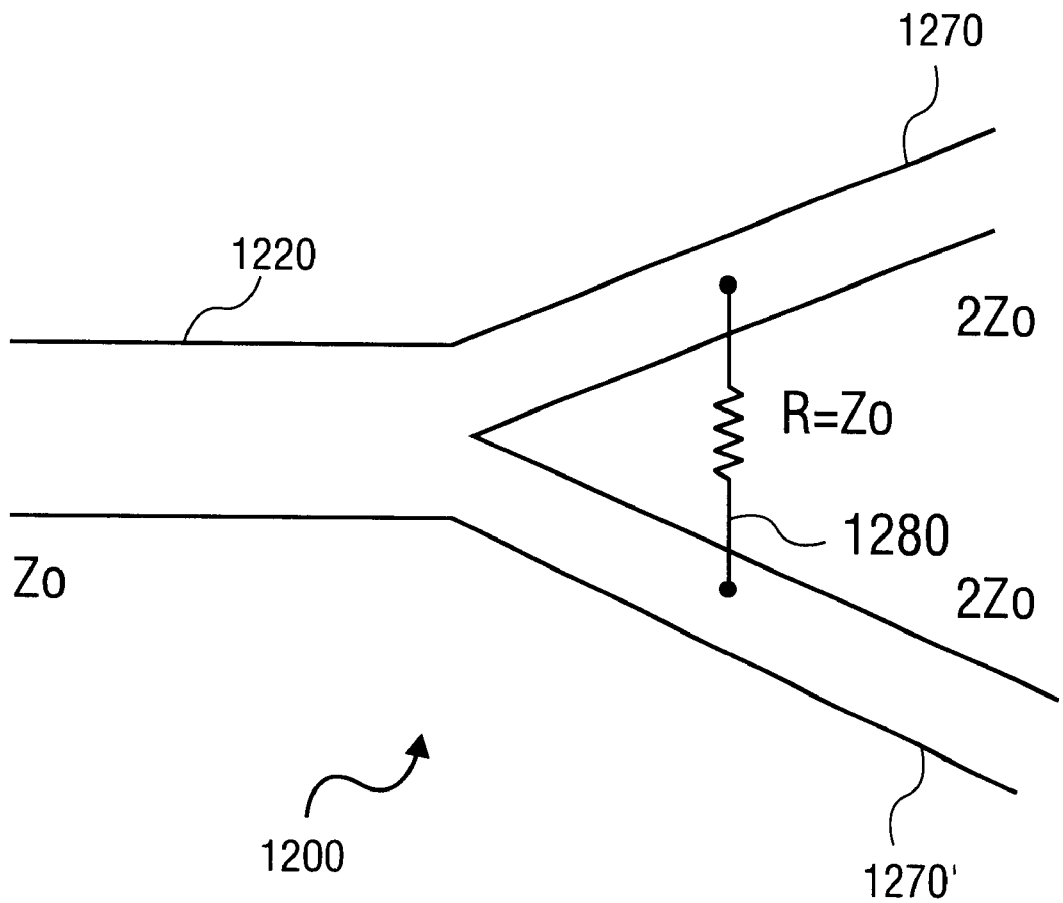
FIG. 12 depicts a prior art power splitter design, the so-called "Wilkerson" power splitter.

FIG. 12 depicts a prior art power splitter design, the so-called "Wilkerson" power splitter. In this structure, a stripline or microstrip transmission line, generally 1200, is split, with the impedance of each branch 1270, 1270' equal to twice the impedance of the root 1220. The resistor 1280 dissipates no power in the normal case, since the voltage across it is zero (by symmetry), but in the event of unbalanced or non-ideal termination of one leg of the stripline 1220, the resistor 1280 dissipates power that would otherwise be reflected, and that would cause problems with the signals flowing down each leg.

Figure 13:
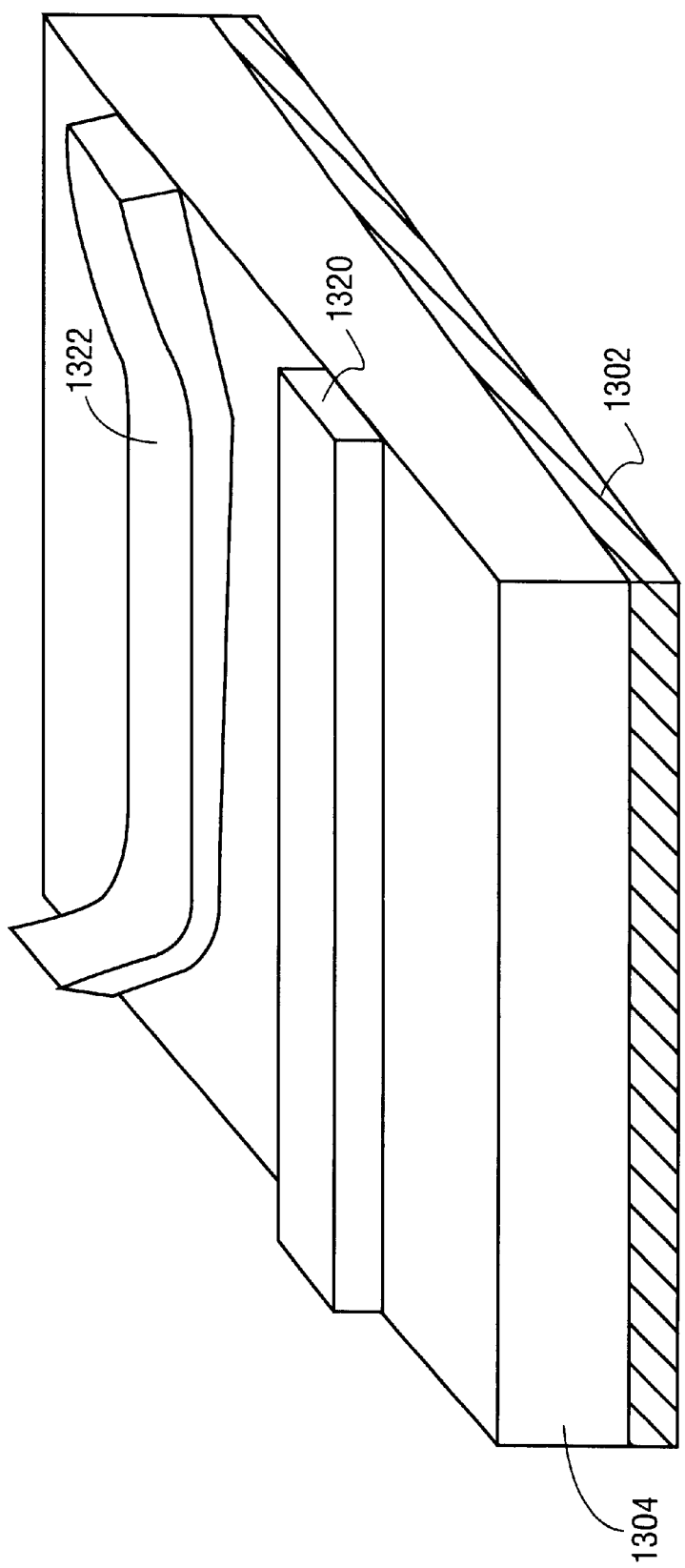
FIG. 13 depicts an embodiment of coupled striplines lying in a single plane.

FIG. 13 depicts an embodiment of coupled striplines, generally 1300, lying in the same plane, which can behave as power splitters. In this structure, one couples the electric and magnetic fields associated with a signal propagating on a first transmission line 1320 into a second parallel transmission line 1322. The two transmission lines have parallel portions, which is the region where the coupling occurs, and may have other regions where they diverge from one another or lie relatively far apart, so that there is substantially no interaction between them. When the parallel transmission lines are suitably closely spaced, a signal propagated along the first can induce a signal in the second. As is well known from transmission line theory, this coupling results in a forward propagating wave induced on the undriven transmission line, proportional to the derivative of the driven waveform. The magnitude of this waveform is controlled by the geometry of the coupler, increasing for closer spacing of the lines. The coupler further has an insulating layer or dielectric 1304 that carries the two striplines 1320 and 1322, and there is a ground plane 1302 on the opposite surface of the dielectric layer 1304.

Figure 14D:
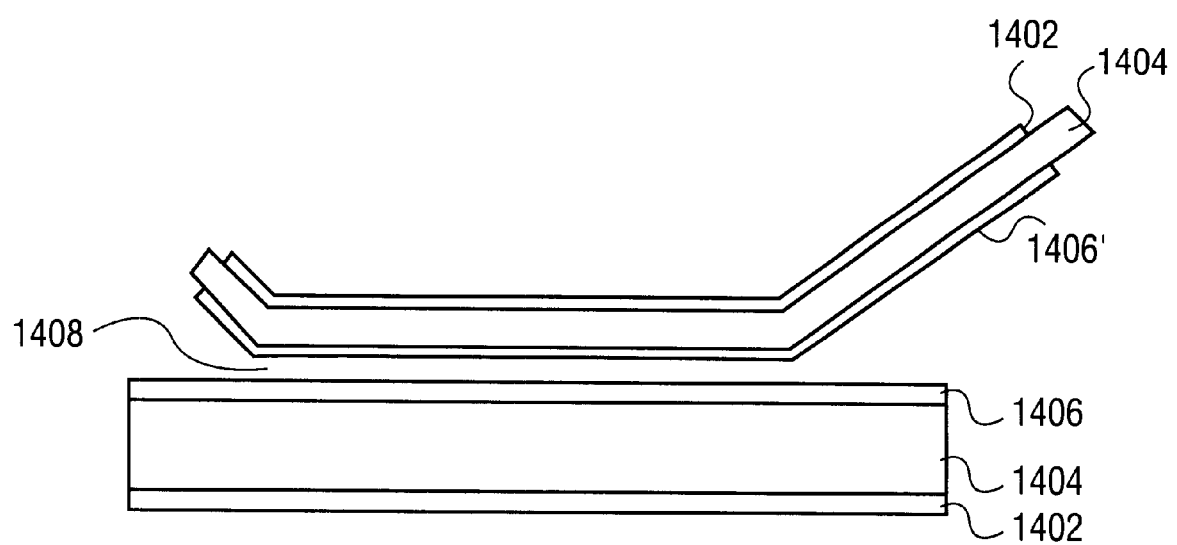
FIGS. 14A, 14B and 14C depict three views of an embodiment of the transmission line of the present invention.

FIGS. 14A, 14B, 14C and 14D, which will be referred to generally as FIG. 14, depict various views of embodiments of the transmission line bus and digital device interface of the present invention. The coupled power splitters of FIG. 13 can be fabricated as a pair of physically separable units 1400, 1400' as shown in FIGS. 14A, 14B, 14C and 14D. Each unit 1400, 1400' consists of a ground plane 1402, 1402', a dielectric material 1404, 1404', and a microstrip transmission line 1406, 1406'. The two units 1400, 1400' are placed one atop the other, such that the ground planes 1402, 1402' are relatively outermost, while the microstrip lines 1406, 1406' are parallel, and separated by a dielectric layer (air or another dielectric material) 1408. In one embodiment, insulators 1407, 1407' can be placed on top of one or more of the microstrip lines 1406, 1406'. The power splitter, or directional coupler, formed with this technique is an intrinsically high frequency structure, capable of performance well into the microwave region. Such a structure is unable to transmit DC or low frequency signals, although it has dramatic advantages over conventional connector techniques for transmitting high frequency signals. Among such advantages are the lack of metal interfaces, eliminating corrosion and the need for precious metals, the lack of most parasitic capacitance and inductance associated with conventional connectors, and the ease of fabrication using conventional lithographic methods of circuit manufacture. The basic structure of FIG. 14B can be replicated multiple times in parallel, to form multiple transmission line paths. Two such paths can be used for differential signaling. Multiple paths can similarly be used to transmit parallel data streams. One or more of such parallel paths can be used as one possible method to carry the required reference signal or signals. In one embodiment, the modulated data and a reference signal are carried on the same microstrip line 1406, 1406'.

One or both of the dielectric layers 1404, 1404' of FIG. 14 can be constructed from a flexible printed circuit board material, such that the mechanical interface between the two units 1400, 1400' allows for mechanical misalignment and imperfection.

Similarly, the width of the microstrip line on one of the units of FIG. 14 can be wider than that of the other unit, allowing some tolerance to mechanical misalignment of the two units, with little effect on the magnitude of the electrical and magnetic coupling.

The two units of FIG. 14 can be held together with a mechanical clamping arrangement, such that they will not be subject to vibration or slippage. An elastomeric material can be used to allow compliance in such a clamping arrangement. The elastomeric properties of the dielectric in one or more of the units can itself act as such a compliant material. For example, the bending of a flexible printed circuit board material will exert force that can be used to hold one unit in contact with the other, as shown in FIG. 15.

Figure 15:
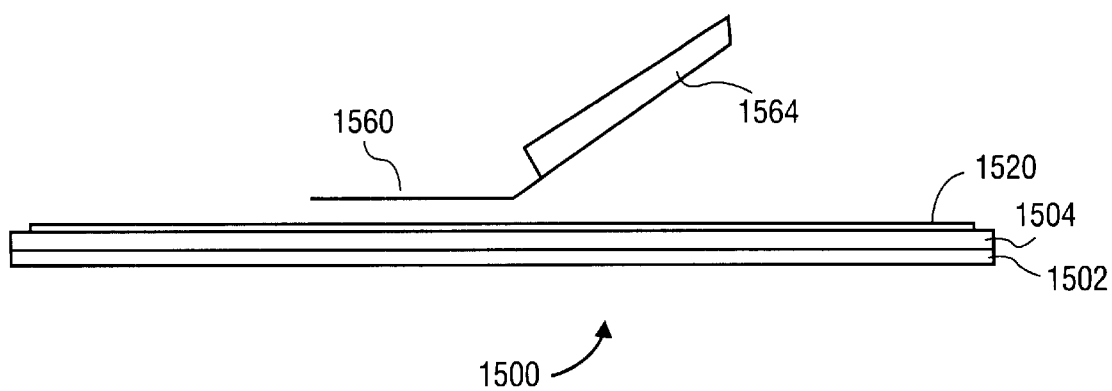
FIG. 15 depicts an embodiment of a digital device interface electromagnetically connected to a transmission line bus of the present invention.

FIG. 15 depicts an embodiment of a digital device interface electromagnetically connected to a transmission line bus of the present invention. A stripline 1520 is present on an upper surface of a dielectric sheet 1504 that has a ground plane 1502 attached to its lower surface. The dielectric can be made from any one of a number of insulating materials, such as fiberglass-epoxy, polyimide, RT-Duroid or alumina. In this embodiment, a digital device interface 1560 which is constructed as shown in FIG. 14D is held in position adjacent to stripline 1520 so that signals propagating in one object may generate or induce signals that propagate in the other object. A digital device 1564 is electrically connected to digital device interface 1560. The digital device 1564 can include a modulator/demodulator capability, or alternatively such capability can be provided by another device (not shown) that is attached to digital device interface 1560.

One possible fabrication technique for the embodiments depicted in FIGS. 14 and 15 is the construction of a printed circuit board comprising one or more layers of flexible PC board materials. Portions of such a board could be rigid, providing mechanical support and conventional advantages of printed wiring boards. Other portions could be flexible, enabling easy use of those sections in configurations such as depicted in FIG. 15.

Typically, one or more DC power and ground connections are required between independently fabricated components. In one embodiment, such DC connections can be provided through the use of conventional connector techniques. One embodiment for the design of such connectors is to place the connectors on each side of the digital device interface as shown in FIGS. 16A and 16B.

FIGS. 16A and 16B depict an alternative embodiment of a digital device interface of the present invention showing connections for the provision of DC power and ground signals. FIG. 16A is a top view, and FIG. 16B is a side view, of an embodiment in which there are shown a plurality of striplines 1620, 1620', each of which is capable of performing as a transmission line bus of the present invention. A common dielectric insulator sheet 1604 supports these striplines. A ground plane 1602 is present on the opposite surface of dielectric sheet 1604, which is depicted only in FIG. 16B. Digital device interface 1660 is positioned adjacent the striplines 1620, 1620' and spaced a suitable distance from the striplines 1620, 1620' so that there is no direct contact between the striplines 1620, 1620' and the corresponding stripline conductors (not shown) that are present on the surface of the digital device interface nearest the striplines 1620, 1620'. In one embodiment, an air gap may be maintained between the striplines 1620, 1620' and the corresponding stripline conductors (not shown) that are present on the surface of the digital device interface. In another embodiment, an insulator of suitable thickness may be interposed between the striplines 1620, 1620' and the corresponding stripline conductors (not shown) that are present on the surface of the digital device interface. In one embodiment, there are a plurality of clamps 1690 which support the dielectric insulator sheet 1604 and the digital device interface 1660 in appropriate relative position and orientation to allow electromagnetic communication between the corresponding stripline conductors 1420, 1420' while preventing the conductors from touching each other, and with the provision of a direct connection between the required DC power conductor and ground conductor present on the digital device interface and corresponding DC power conductor 1616 and ground conductor 1618 present on the surface of the dielectric insulator sheet adjacent to the striplines 1620, 1620'.

When such DC connections are used to deliver power and ground, it is often advantageous to filter and bypass such power and ground signals on the module. Because power and ground connections are carefully controlled, and no DC power can flow elsewhere between the units, it is advantageous to bring the DC power through a balun, to assure balanced current flow. Similarly, it is advantageous to bypass the power with relatively large capacitances on the unit.

Figure 17:
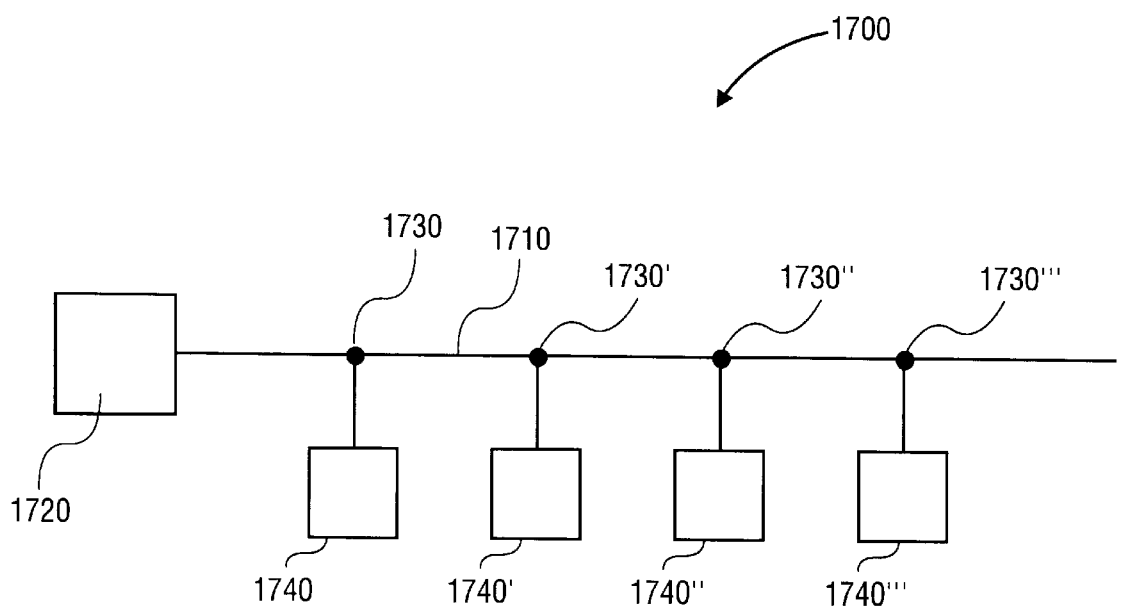
FIG. 17 depicts in schematic form an embodiment of the invention.

FIG. 17 depicts in schematic form an embodiment 1700 of the invention. Transmission line bus 1710 carries modulated digital signals and reference signals driven or received by bus interface 1720, communicating through an electromagnetic coupling 1730, 1730', 1730", 1730''', to one or more of the digital component interfaces 1740, 1740' 1740", 1740''', respectively. Transmission of modulated digital data in the reverse direction can also be accomplished by causing a digital component interface, for example, 1740, to modulate digital data in conjunction with a reference signal and can impress the modulated digital data onto transmission line bus 1710 via electromagnetic coupling 1730. The modulated data signal can then be received by bus interface 1720, and bus interface 1720 can then demodulate the modulated digital data in conjunction with a reference signal. Furthermore, a digital component interface, for example, 1740, can modulate digital data in conjunction with a reference signal and can impress the modulated digital data onto transmission line bus 1710 via electromagnetic coupling 1730. The modulated data signal can then be received by digital component interfaces 1740', 1740" and 1740''' via electromagnetic couplings 1730', 1730" and 1730''', respectively, and the intended recipient digital component interface, for example 1740', can then demodulate the modulated digital data in conjunction with a reference signal.

Figure 18:
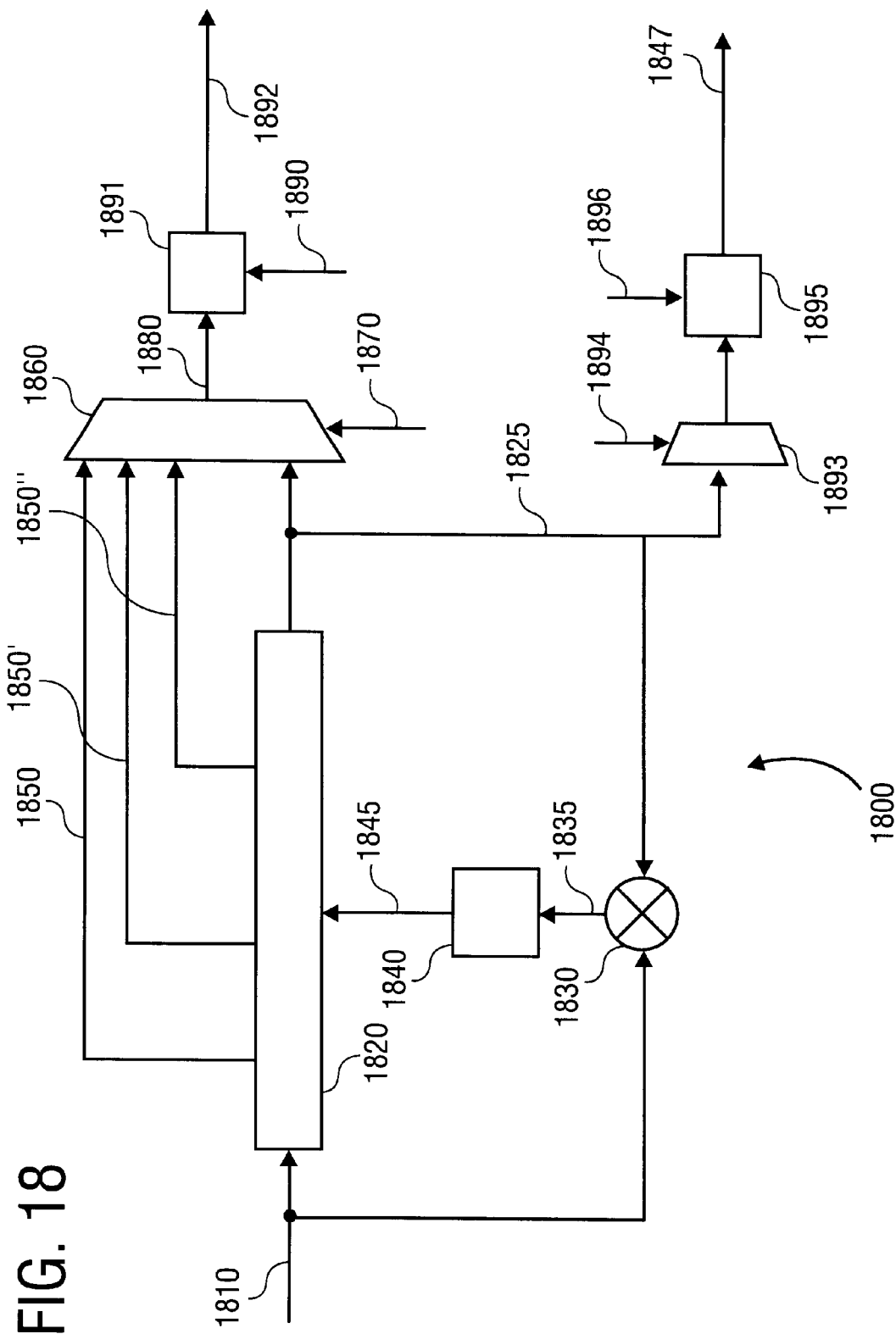
FIG. 18 depicts an embodiment of a quadrature amplitude modulator according to the present invention.

FIG. 18 depicts an embodiment of a quadrature amplitude modulator 1800 according to the present invention. An input reference signal 1810 drives a delay controllable, multiple output delay line 1820. Output reference signal 1825, a delayed version of input reference signal 1810, is phase compared to input reference signal 1810 in phase comparator or mixer 1830, producing a phase comparator output signal 1835. Phase comparator output signal 1835 is low pass filtered in filter 1840, producing delay control signal 1845 which controls the delay of variable delay 1820, thus locking the delay of delay line 1820 to the period of reference input 1810. Output taps 1850, 1850', 1850" and output reference signal 1825 of delay line 1820 each provide a copy of input reference signal 1810 with different delays depending on the location of the output tap 1850, 1850', 1850". One of these delayed signals 1825, 1850, 1850', 1850" is selected by selector 1860, which is controlled by digital input signal 1870. The selected delayed signal 1825, 1850, 1850', 1850" controls the phase of phase modulated signal 1880. Phase modulated signal 1880 then drives into amplitude modulator 1891, controlled by digital input 1890, producing output data signal 1892 that carries both phase and amplitude modulated information.

Reference phase signal input 1825 is also sent through selector 1893 substantially matched to selector 1860, and through amplitude modulator 1895, substantially matched to amplitude modulator 1891, to produce output reference signal 1897. Control signals 1894 and 1896 are provided as selected values. These control signals 1894 and 1896 allow reference output 1897 to have known phase and amplitude.

Figure 19:
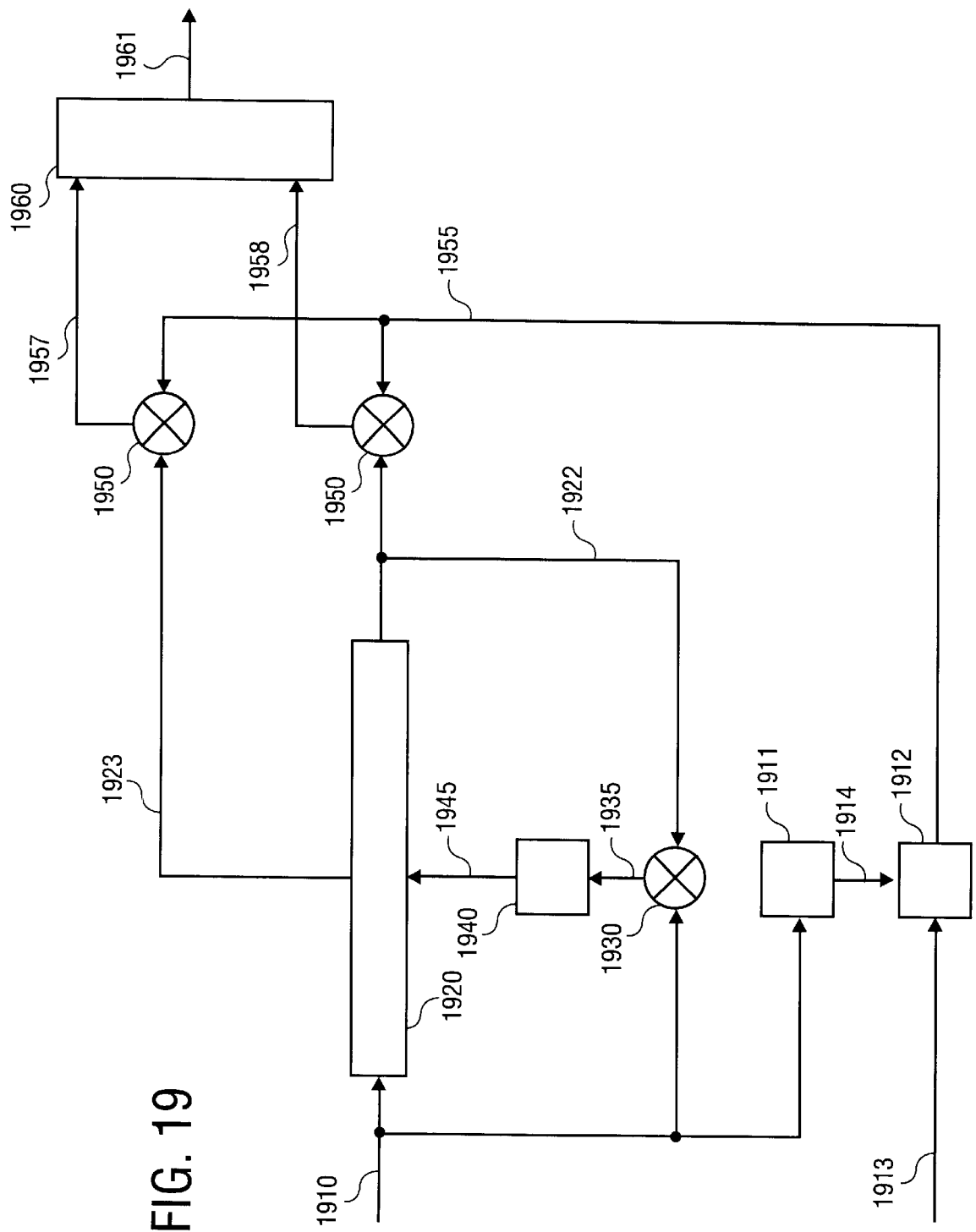
FIG. 19 depicts an embodiment of a quadrature amplitude demodulator according to the present invention.

FIG. 19 depicts an embodiment of a quadrature amplitude demodulator 1900 according to the present invention. Reference input signal 1910 drives a delay controllable, multiple output delay line 1920. An output signal 1922 of the delay line 1920 drives phase comparator or mixer 1930, which is also driven by reference input signal 1910. The phase comparator output signal 1935 of phase comparator 1930 drives a low pass filter 1940, whose output signal 1945 controls the delay of delay line 1920.

Reference input signal 1910 is analyzed by amplitude measuring device 1911 which produces measured reference amplitude 1914. Measured reference amplitude 1914 controls the gain of variable gain amplifier 1912 which acts on data input signal 1913 to produce gain normalized input signal 1955.

Delay line output 1923 and 1922 of delay line 1920 are substantially in quadrature and driver mixers or phase comparators 1950, 1950' whose other input is the gain normalized input signal 1955, recovering I and Q quadrature components of gain normalized input signal 1955 on outputs 1957 and 1958. Quadrature components 1957 and 1958 drive comparator and digitizer 1960 which produce digital output values 1961, representing decoded versions of gain normalized input signal 1955.

An Example of One System Design

QAM signals are differentially driven onto a pair of microstrip transmission lines, located on a dielectric insulator sheet, which can be a motherboard. The microstrip lines are series terminated in their characteristic impedance at the driver, and parallel terminated in their characteristic impedance at the far end of the line. The parallel termination is done with a pair of chip resistors tied to a large, grounded, NPO chip capacitor, augmented with a high performance PC board fabricated capacitor.

The motherboard microstrip transmission lines are designed with a characteristic impedance of 50 ohms, over a 0.010 inch thick dielectric layer on a solid ground plane. The resulting line width of approximately 0.017 inch is sufficiently wide to provide mechanical margins for the connector assembly, as described below.

Digital device interfaces, or modules, are coupled to the motherboard traces, using a flexible printed wiring board technology. Microstrip transmission lines are fabricated on a 0.005 inch thick dielectric material flexible PC board, over a solid copper ground plane. These module transmission lines have a reduced width of approximately 0.008 inches, providing a similar width to length (W/L) ratio as the motherboard traces, and thus a similar 50 ohm characteristic impedance. These traces are spaced on the same center to center spacing as the motherboard traces.

When the module traces are overlaid on the motherboard traces, a pair of coupled transmission lines is formed, fabricating a microwave directional coupler. At frequencies where the length of the interconnection is small compared to a quarter-wavelength of the electrical signals, this coupling is perhaps best modeled as a capacitance, although inductive coupling components exist even in this situation. For longer coupling lengths, or for higher frequencies, the coupled transmission lines behave as microwave directional couplers.

The module transmission lines are also terminated at both ends by chip resistors and capacitors in a similar configuration to the motherboard on one end, and by on-chip receiver terminations on the other end. Module chip components are mounted on the ground plane side of the flexible PC board, to avoid interference with the mechanical coupling of the module to the motherboard traces. The connector assembly for the module consists primarily of a mechanical alignment jig that holds the module in position. The fact that module traces are significantly narrower than the motherboard traces assures that precise alignment is not necessary to achieve near perfect matching of the characteristics of the two differential signals. Misalignments of up to 0.004 inches are allowed with little change in coupled capacitance or inductance. An insulating solder mask layer covering the connection region provides spacing between the module and motherboard traces. Control of layer thickness provides a mechanism for adjusting the coupling strength of the microwave coupler.

With this design, one can largely eliminate the parasitic components normally associated with design of multi-drop memory module wiring. No longer is there a reflective stub, series inductance due to poor connector design, or high capacitive loading of the bus leading to low impedance levels and slow signal propagation speed. Instead, signals propagating down the motherboard transmission line are split, reduced in amplitude, and coupled smoothly into the module assembly.

Phase and amplitude reference signals are propagated from the transmitter to the receiver on a dedicated differential pair, similar in all aspects to the signal wiring. Since the phase and amplitude of this reference signal is known, one can compare the phase and amplitude of the received data with it to compensate for unknown delay and loss in the transmission line environment.

In particular, the phase of the reference signal is used to generate a phase locked set of reference clocks that are then used to demodulate the QAM signal. Eight distinct phases are generated, in true and complement form, using a set of variable delay differential inverters. The delayed version of the reference signal is phase compared to an undelayed copy of itself, to lock the loop.

The amplitude of the reference signal is used to drive an automatic gain control circuit, adjusting the gain of the amplifier for the reference signal so that it matches an internal reference standard. The same gain is then applied to all of the other received signals, assuring a good match of the amplitude of the received signals with the reference amplitude.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A high speed digital distribution system comprising:
    a transmission line bus that carries modulated digital signals and reference signals, said transmission line bus comprising a first end;
    a bus interface electrically connected to said first end of said transmission line bus, said bus interface modulating digital data onto said transmission line bus and demodulating modulated digital data signals received from said transmission line bus, and being adapted to transmit and to receive a reference signal; and
    at least one digital component interface in electromagnetic communication with said transmission line bus, said digital component interface modulating digital data onto said transmission line bus and demodulating modulated digital data signals received from said transmission line bus, and being adapted to transmit and to receive a reference signal;
    wherein said transmission line bus communicates modulated digital data in association with said reference signal between and among an external device connected to said bus interface and said at least one digital component interface.

2. The system of claim 1 further comprising a reference source adapted to provide a reference signal to at least one of said bus interface and said at least one digital component interface.

3. The system of claim 1 further comprising a digital component electrically connected to one of said at least one digital component interface, said component being adapted to transmit and to receive said digital data in conjunction with said reference signal.

4. The system of claim 1 wherein said reference signal comprises a phase component and an amplitude component.

5. The system of claim 4 wherein said digital data is quadrature amplitude modulated with said reference signal.

6. The system of claim 5 wherein said digital data is encoded using one to five bits for the phase component and zero to three bits for the amplitude component.

7. The system of claim 1 wherein the digital data is frequency modulated with said reference signal.

8. The system of claim 1 wherein the digital data is spread spectrum encoded with said reference signal.

9. The system of claim 1 wherein the digital data is amplitude modulation encoded with said reference signal.

10. The system of claim 1 wherein the digital data is single sideband encoded with said reference signal.

11. The system of claim 1 wherein said bus further comprises a second end, a characteristic impedance, and a matched termination attached to one of said first end and said second end of said transmission line bus.

12. The system of claim 11 further comprising a plurality of matched terminations wherein said matched terminations comprise a series termination impedance substantially equal to said characteristic impedance, said series termination connected between said first end of said transmission line bus and said bus interface, said bus interface representing a voltage source, and a parallel termination impedance substantially equal to said characteristic impedance, said parallel termination connected between said second end of said transmission line bus and ground.

13. The system of claim 11 further comprising a plurality of matched terminations wherein said match terminations comprise a parallel termination impedance substantially equal to said characteristic impedance, said parallel termination connected between said first end of said transmission line bus and ground, said bus interface representing a current source, and a parallel termination impedance substantially equal to said characteristic impedance, said parallel termination connected between said second end of said transmission line bus and ground.

14. The system of claim 1 wherein the digital component interface further comprises an interface transmission line that couples electromagnetic radiation to and from the transmission line bus.

15. The system of claim 14 wherein said interface transmission line further comprises a characteristic impedance termination at a first end.

16. The system of claim 1 wherein said digital component interface further comprises a directional coupler in communication with said transmission line bus, said directional coupler coupling electromagnetic radiation to and from the transmission line bus.

17. The system of claim 16 wherein said digital component interface is removably attached to said system.

18. The system of claim 17 wherein said digital component interface is adapted to be attached or detached from said system while said system is in operation.

19. The system according to claim 1 wherein the digital component interface further comprises an electrical connection to a power supply.

20. The high-speed digital distribution system of claim 1, further comprising a reference signal wherein said reference signal is multiplexed onto the same conductor of said transmission line bus as the modulated data signal.

21. An apparatus for distributing digital signals, the apparatus comprising:
    a transmission line bus having a first end;
    a first interface, said interface being electrically connected to said first end of said transmission line bus;
    a second interface, said interface being electromagnetically coupled to said transmission line bus;
    a reference signal source that provides a reference signal including a phase component and an amplitude component;
    a first digital device electrically connected to said first interface; and
    a second digital device electrically connected to said second interface;
    wherein one of said first interface and said second interface modulates digital data provided by said digital data device connected thereto with said reference signal to encode the digital data in a quadrature amplitude modulated signal and transmits said modulated data onto said transmission line bus, and another of said first interface and said second interface receives and demodulates said modulated digital data and provides said demodulated data to said digital device connected thereto.

22. A method of distributing digital signals, the method comprising the steps of:
    providing a reference signal;
    providing a transmission line bus;
    providing a first interface and a second interface, at least one interface being electrically connected to said transmission line bus, and at least one interface being electromagnetically coupled to said transmission line bus, both interfaces adapted to receive and to transmit said reference signal;
    providing digital data to said first interface;
    causing said first interface to modulate said digital data in conjunction with said reference signal and to impress said modulated data onto said transmission line bus in conjunction with said reference signal; and
    causing said second interface to receive and demodulate said modulated digital data in conjunction with said reference signal.

23. The method according to claim 22 wherein the step of causing said first interface to modulate said digital data with said reference signal and to impress said modulated data onto said bus in conjunction with said reference signal comprises the step of causing said first interface to quadrature amplitude modulate said digital data with said reference signal and to impress said modulated data onto said transmission line bus in conjunction with said reference signal.

24. The method according to claim 23 wherein the digital data is encoded using one to five bits for a phase component and zero to three bits for an amplitude component.

25. The method according to claim 22 wherein the step of causing said first interface to modulate said digital data with said reference signal and to impress said modulated data onto said transmission line bus in conjunction with said reference signal comprises the step of causing said first interface to frequency modulate said digital data with said reference signal and to impress said modulated data onto said transmission line bus in conjunction with said reference signal.

26. The method according to claim 22 wherein the step of causing said first interface to modulate said digital data with said reference signal and to impress said modulated data onto said transmission line bus in conjunction with said reference signal comprises the step of causing said first interface to spread spectrum modulate said digital data with said reference signal and to impress said modulated data onto said transmission line bus in conjunction with said reference signal.

27. The method according to claim 22 wherein the step of causing said first interface to modulate said digital data with said reference signal and to impress said modulated data onto said transmission line bus in conjunction with said reference signal comprises the step of causing said first interface to amplitude modulate said digital data with said reference signal and to impress said modulated data onto said transmission line bus in conjunction with said reference signal.

28. The method according to claim 22 wherein the step of causing said first interface to modulate said digital data with said reference signal and to impress said modulated data onto said transmission line bus in conjunction with said reference signal comprises the step of causing said first interface to single sideband modulate said digital data with said reference signal and to impress said modulated data onto said transmission line bus in conjunction with said reference signal.

29. The method according to claim 22 further comprising the steps of providing an additional electromagnetically coupled interface to said transmission line bus while the transmission line bus is in operation; and when a plurality of electromagnetically coupled interfaces are present, removing an electromagnetically coupled interface while the transmission line bus is in operation.

30. The method according to claim 22 further comprising the step of transmitting modulated data between and a plurality of electromagnetically coupled interfaces.

31. A high-speed digital distribution system comprising:
a transmission line bus that carries modulated digital signals and reference signals, said transmission line bus comprising a first end;
a bus interface electrically connected to said first end of said transmission line bus, said bus interface modulating digital data onto said transmission line bus and demodulating modulated digital data signals received from said transmission line bus, and being adapted to transmit and to receive a reference signal; and
at least one digital component in electromagnetic communication with said transmission line bus, said digital component modulating digital data onto said transmission line bus and demodulating modulated digital data signals received from said transmission line bus, and being adapted to transmit and to receive a reference signal;
wherein said transmission line bus communicates modulated digital data in association with said reference signal between and among an external device connected to said bus interface and said at least one digital component.

32. The system of claim 31 further comprising a reference source adapted to provide a reference signal to at least one of said bus interface and said at least one digital component.

33. The system of claim 31 wherein said reference signal comprises a phase component and an amplitude component.

34. The system of claim 33 wherein said digital data is quadrature amplitude modulated with said reference signal.

35. The system of claim 34 wherein said digital data is encoded using one to five bits for the phase component and zero to three bits for the amplitude component.

36. The system of claim 31 wherein the digital data is frequency modulated with said reference signal.

37. The system of claim 31 wherein the digital data is spread spectrum encoded with said reference signal.

38. The system of claim 31 wherein the digital data is amplitude modulation encoded with said reference signal.

39. The system of claim 31 wherein the digital data is single sideband encoded with said reference signal.

40. The system of claim 31 wherein said bus further comprises a second end, a characteristic impedance, and a matched termination attached to one of said first end and said second end of said transmission line bus.

41. The system of claim 40 further comprising a plurality of matched terminations wherein said matched terminations comprise a series termination impedance substantially equal to said characteristic impedance, said series termination connected between said first end of said transmission line bus and said bus interface, said bus interface representing a voltage source, and a parallel termination impedance substantially equal to said characteristic impedance, said parallel termination connected between said second end of said transmission line bus and ground.

42. The system of claim 40 further comprising a plurality of matched terminations wherein said matched terminations comprise a parallel termination impedance substantially equal to said characteristic impedance, said parallel termination connected between said first end of said transmission line bus and ground, said bus interface representing a current source, and a parallel termination impedance substantially equal to said characteristic impedance, said parallel termination connected between said second end of said transmission line bus and ground.

43. The system of claim 31 wherein said digital component further comprises a directional coupler in communication with said transmission line bus, said directional coupler coupling electromagnetic radiation to and from the transmission line bus.

44. The system of claim 43 wherein said digital component is removably attached to said system.

45. The system of claim 44 wherein said digital component is adapted to be attached or detached from said system while said system is in operation.

46. The system according to claim 31 wherein the digital component further comprises an electrical connection to a power supply.

47. A high-speed digital distribution system comprising:
a reference signal source that provides reference signals;
a transmission line bus that carries modulated digital signals and reference signals, said transmission line bus comprising a first end;
a first interface and a second interface, each of said interfaces being electromagnetically coupled to said transmission line bus, both interfaces adapted to transmit and to receive a reference signal, said first interface being provided with digital data;
wherein said first interface modulates digital data in conjunction with said reference signal and impresses said modulated digital data onto said transmission line bus, and said second interface receives said modulated digital data and demodulates said modulated digital data received from said transmission line bus in conjunction with said reference signal.

48. A method of distributing digital signals, the method comprising the steps of:
providing a reference signal;
providing a transmission line bus;
providing a first interface and a second interface, each of said interfaces being electromagnetically coupled to said transmission line bus, each interface adapted to receive and to transmit said reference signal;
providing digital data to said first interface;
causing said first interface to modulate said digital data in conjunction with said reference signal and to impress said modulated data onto said transmission line bus in conjunction with said reference signal; and
causing said second interface to receive said modulated data in conjunction with said reference signal and to demodulate said modulated data in conjunction with said reference signal.

* * * * *